(12) United States Patent
Tang

(10) Patent No.: US 6,570,465 B2
(45) Date of Patent: May 27, 2003

(54) MULTI-TAP KIT FOR CABLE TELEVISION SYSTEMS

(76) Inventor: Danny Q. Tang, 2 Taylorr Lake Ct., Manalapan, NJ (US) 07726

( * ) Notice: Subject to any disclaimer, the term of this patent is extended or adjusted under 35 U.S.C. 154(b) by 0 days.

(21) Appl. No.: 09/727,891

(22) Filed: Dec. 1, 2000

(65) Prior Publication Data

US 2002/0067222 A1 Jun. 6, 2002

(51) Int. Cl.[7] ................................................ H03H 9/74
(52) U.S. Cl. ...................................... 333/109; 333/112
(58) Field of Search ................................. 333/109, 112

(56) References Cited

U.S. PATENT DOCUMENTS

| | | | | |
|---|---|---|---|---|
| 3,717,813 A | * | 2/1973 | Lieberman et al. | 725/149 |
| 3,881,160 A | | 4/1975 | Ross | 333/109 |
| 3,895,318 A | | 7/1975 | Ross | 333/109 |
| 4,578,702 A | | 3/1986 | Campbell, III | |
| 4,755,776 A | * | 7/1988 | Preschutti | 333/100 |
| 4,963,966 A | * | 10/1990 | Harney et al. | 380/52 |
| 5,058,198 A | * | 10/1991 | Rocci et al. | 333/100 |
| 5,281,933 A | | 1/1994 | Chamberlin | 333/132 |
| 5,892,653 A | | 4/1999 | Nishimuta et al. | 361/643 |
| 6,033,101 A | * | 3/2000 | Reddick et al. | 700/286 |
| H1879 H | * | 10/2000 | Spriester et al. | 725/119 |
| 6,292,371 B1 | * | 9/2001 | Toner, Jr. | 174/52.1 |

* cited by examiner

*Primary Examiner*—Justin P. Bettendorf
(74) *Attorney, Agent, or Firm*—Watov & Kipnes, P.C.; Kenneth Watov

(57) ABSTRACT

A cable television multi-tap system for forwarding signals to multiple customers from a main cable, and for receiving individual return signals from respective subscribers includes a printed circuit board secured to the inside face of the respective tap plates of a plurality of multi-taps, respectively, with each printed circuit board including at least first and second electrical receptacles for receiving a selected one of a plurality of first and second plug-in modules, respectively, said plurality of first plug-in modules providing different levels of directional coupling, respectively, and said plurality of second plug-in modules providing individually one or a combination of different levels of forward equalization, return path or backward equalization, cable simulation, high tap value filtering, high pass filtering, low pass filtering, band rejection, shunting, and noise filtering to optimize the signal quality of signals forwarded from the headend of the system to subscribers, and return signals from subscribers back to the headend.

18 Claims, 30 Drawing Sheets

$n = 2, 3, 4 \ldots$

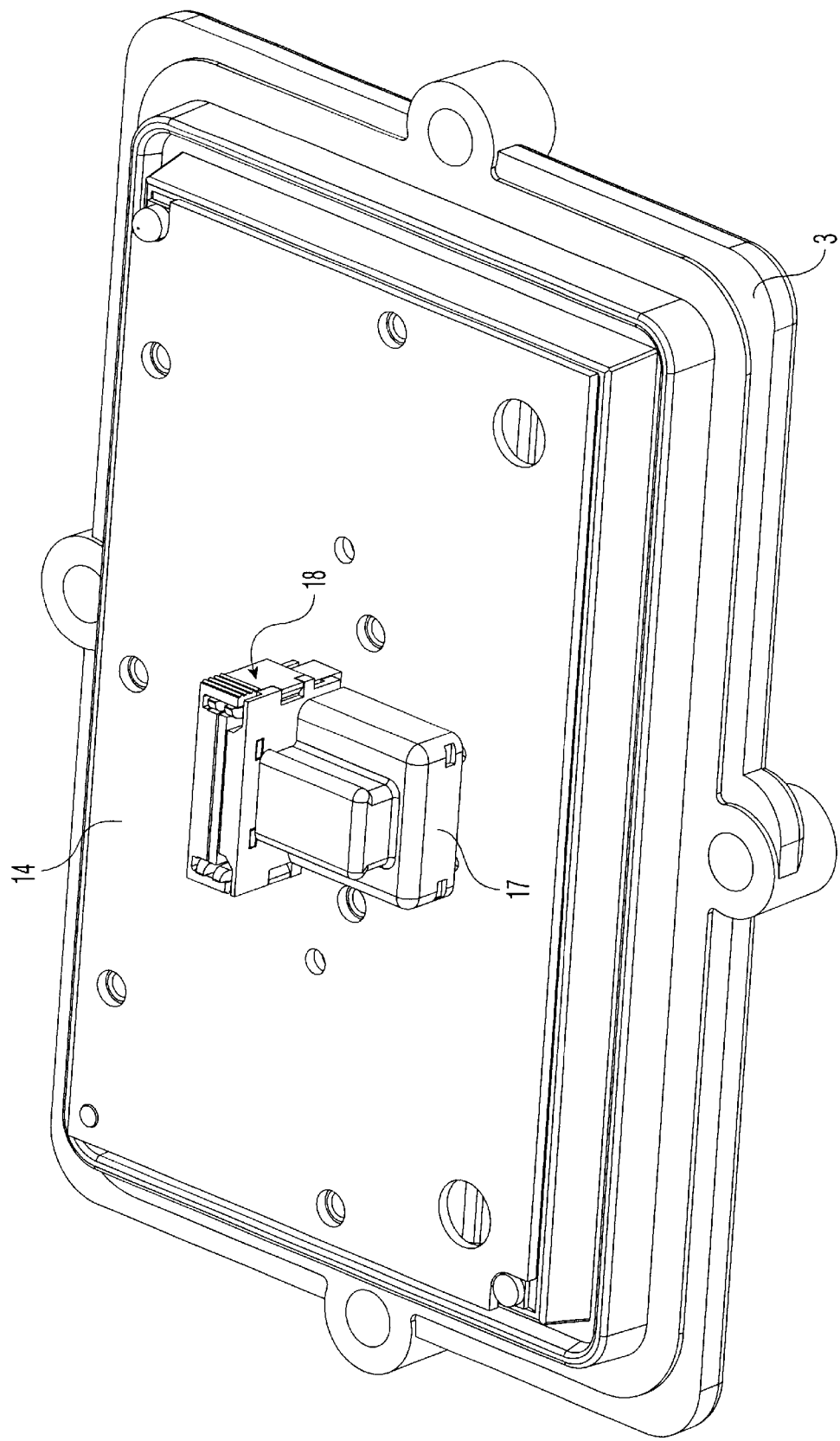

MULTI-TAP KIT FOR CABLE TELEVISION SYSTEMS

FIELD OF THE INVENTION

The present invention relates generally to multi-taps, and more particularly to multi-taps that incorporate directional coupling, forward and/or reverse path equalization, signal filtering and rejection, and so forth.

BACKGROUND OF THE INVENTION

In present cable television operating systems television and other signals, such as data signals, are transmitted from a main source known as the "headend" to remote subscribers, such as households. In typical cable operating systems the signal communication is unidirectional or a one-way transmission from the headend to the subscriber. In such systems, the transmitted signal is typically generated from a single signal source, permitting cable operators to maintain high quality signals for reception by the subscribers through use of tight tolerances, high quality shielding, and forward equalization to maintain reliable transmission. Recent advances in cable television have allowed subscribers to become interactive, that is to transmit return signals, typically through use of a modem, back to the headend. As a result, many cable systems now provide an active return path, but the signal sources such as modems at each subscriber and electrical noise generated from each household return signals that contain noise, whereby the noise sources are additive from all subscribers generating return signals at a given time. It is very difficult in present systems using known means to maintain a high quality return path, in that the cable operator cannot maintain any meaningful control of the signal source generating the return signal from each subscriber's home, for example.

The three primary sources of noise generated in the return path of a bidirectional cable television operating system are thermal noise, ingress, and fiber link noise. More specifically, thermal noise is generated by the various electronic components and active devices such as amplifiers. Typically thermal noise is caused by the thermal heating of resistive components.

Ingress noise can be generated from a number of different noise sources. Devices such as citizens band radios, short wave receivers, and amateur radio transmitters can all generate background radiation that causes noise in the return frequency band of the cable television system. Ingress noise can also be generated by broadband noise derived from switching transients, electrical arching, intermittent ground connections, and so forth. Ingress noise can also be generated by other electrical devices used in the home, and by unterminated cable television splitters, and incorrectly or improperly connected cables and connectors used in the household cable television signal distribution. Standard television receivers are not designed to include appropriate filters, and/or attenuators, for rejecting such noise in the frequency band of the return path.

Another source of ingress noise is fiber link noise. Such noise is generated in systems where a radio frequency signal is applied to a laser in the return path, producing an optical output that contains fiber link noise. The fiber link noise signal generated by one or more subscribers is carried through the fiber optical portion of a main cable 61 to a photo receiver in the headend, where such noise may cause unreliable communication.

The typical cable television system presently in use only provides forward path equalization. In such systems, the lack of reverse path equalization permits reverse path signals and/or ingress noise to overdrive amplifiers at the headend causing the output signals of the amplifiers to be non-linear and contain clipping distortion. The present inventor recognized that in order to reduce this problem, the return path must be equalized to provide an equal signal level on a return path from all subscribers, whereby in the worst case no over driving of amplifiers at the headend will occur.

It is known in the prior art to provide multi-tap devices with single plug-in modules that provide the functions of directional coupling and equalization. Accordingly, such prior multi-taps permit a user to select a single plug-in for providing a desired level of directional coupling, and some desired equalization function. Such prior multi-tap devices are an improvement over the use of multi-tap devices having hardwired tap plates, where the entire tap plate must be replaced in order to change the level of directional coupling, and/or equalization or filtering specifications. However, although an improvement over prior hardwired multi-tap devices, the inventory requirements for the single plug-in module multi-tap devices are very burdensome. For example, if a user wishes to have individual plug-in modules for selectively providing ten (10) different levels of directional coupling, thirty five (35) different levels of various equalization functions, and five (5) different levels of filtering, such as high-pass filtering, noise filtering, and/or notch filters, the combination of plug-in modules that must be kept in inventory to permit such selectivity is equal to the multiple of the numbers of different functions desired. In this example, the multiple is (10) (35) (5), which equals 1,750 different plug-in modules that must be kept in inventory. The present inventor recognized that it is costly for a user both to have to purchase 1,750 different plug-ins, or perhaps even a greater number of plug-ins if greater selectivity is required, along with the added cost of maintaining storage space and access to such inventory. Obviously, if a lesser number of different single plug-in modules are retained in inventory, the selectivity capability for different combinations of the aforesaid functions is diminished. Accordingly, there is a long felt need in the art for an improved multi-tap system and devices that permit a user to easily select a combination of different functions for a given multi-tap without requiring an extensive inventory of various components. The present inventor also recognized there will be a significant cost savings if such an improvement is provided on tap plates that can merely be substituted for the tap plates of presently installed multi-taps to avoid the cost of removal and replacement of existing multi-taps.

SUMMARY OF THE INVENTION

With the problems of the prior art in mind, in a first embodiment of the invention, a directional coupler is built into the printed circuit (PC) board secured to the inside face of a tap plate or cover plate of a standard multi-tap housing. The PC board also includes an electrical receptacle for receiving an electrical plug-in device for providing a desired equalization of forward and backward or return signals, and/or level of noise filtering, for example. A plurality of such plug-in devices are provided for permitting a user to select the appropriate plug-in device that provides the closest level of a desired equalization, and/or filtering. Also, the tap plates are designed to permit them to directly replace original tap plates not including this first embodiment, or other embodiments of the invention as described below. In this manner, existing cable television systems do not have to replace the entire multi-tap devices, perhaps requiring cable cutting and installation of different connectors.

In a second embodiment of the invention, dual plug-in devices are provided on the PC board of each tap plate. More specifically, a first electrical receptacle is provided on the PC board for receiving one of a plurality of available first plug-in devices for selectively providing a directional coupler having a desired level of attenuation for signals being tapped off of a main distribution cable. Accordingly, unlike the first embodiment, the directional coupling function is provided in the first plug-in device. Note that the direction of signal flow can be reserved by reversing the positioning of the first plug-in device. Each of the available group of individual first plug-in devices provide directional couplers having different levels of attenuation. A second electrical receptacle is provided on the PC board for receiving a desired one of a plurality of second plug-in devices respectively providing different levels of equalization for forward and return signals, which devices may also include noise filtering, and/or other functions.

Other embodiments of the invention provide three or more plug-in devices. A first group of such plug-in devices permit a user to select a desired level of directional coupling, as in the second embodiment of the invention. Second through nth plug-in devices for plugging into associated receptacles on the PC board permit a wide selection of different levels of backward equalization, forward equalization, noise filtering, low pass filtering, high pass filtering, and so forth, respectively.

BRIEF DESCRIPTION OF THE DRAWINGS

Various embodiments of the present invention are described in detail below with reference to the drawings, in which like items are identified by the same reference designation, wherein:

FIG. 33 shows a pictorial view of the top face of a printed circuit (PC) board mounted on the inside face of a multi-tap tap plate showing the plug-in module of FIGS. 32A–32D on the PC board in combination with a second plug-in module, for the alternative embodiment of the invention.

DETAILED DESCRIPTION OF THE INVENTION

Figure 1:
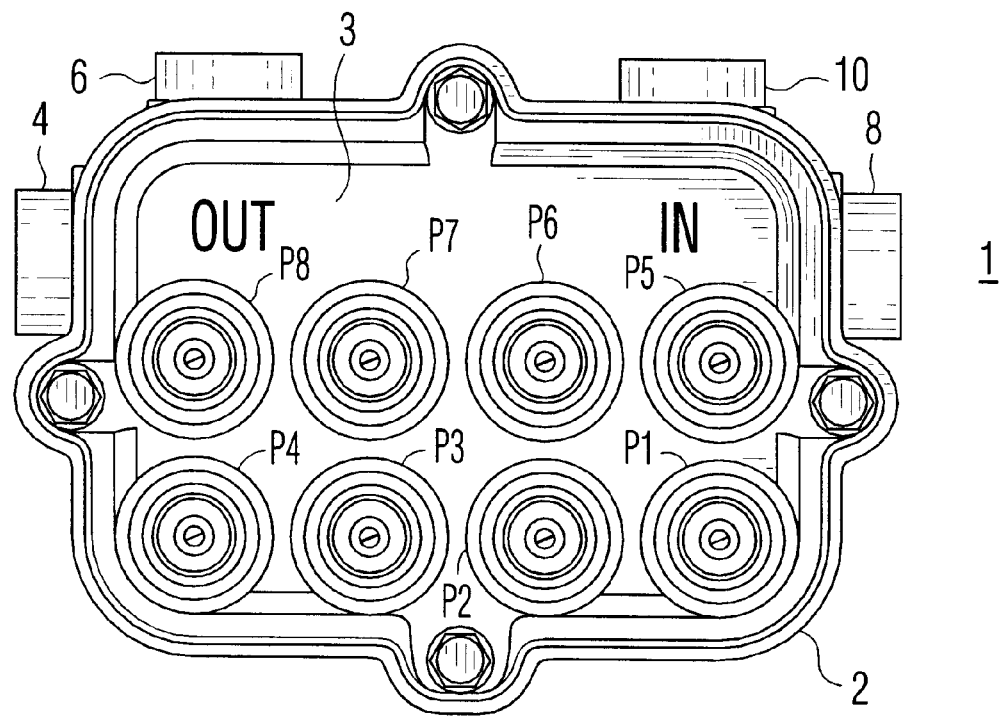
FIG. 1 shows a prior art top view of a multi-tap tap plate mounted in the housing of the multi-tap.

In FIG. 1, a typical known multi-tap 1 is shown. The multi-tap 1 includes a housing 2, output ports 4 and 6 for continuing the main cable 61 (see FIG. 10, for example) run of the cable television system down line, and two input ports 8 and 10 for receiving a main cable 61. The pair of output ports 4 and 6, and pair of input ports 8 and 10, are at 90 degrees to one another, whereby only one of each pair is utilized in a given installation. This port configuration facilitates the installation of the multi-tap of the main cable 61 of the system. A tap plate 3 is installed within the housing 2, as shown. A plurality of subscriber tap ports P1 through P8, also known as F-ports, are shown in this example, for forwarding signals to a respective household or subscriber, and for receiving return signals therefrom in certain installations. The present invention, from an exterior viewpoint, will provide multi-taps that appear substantially as shown in FIG. 1. The number of subscriber tap ports provided, are determined by the particular application, whereby although eight such ports P1–P8 are shown in this example, in typical applications the number of subscriber tap ports provided may be other than eight.

Figure 2:
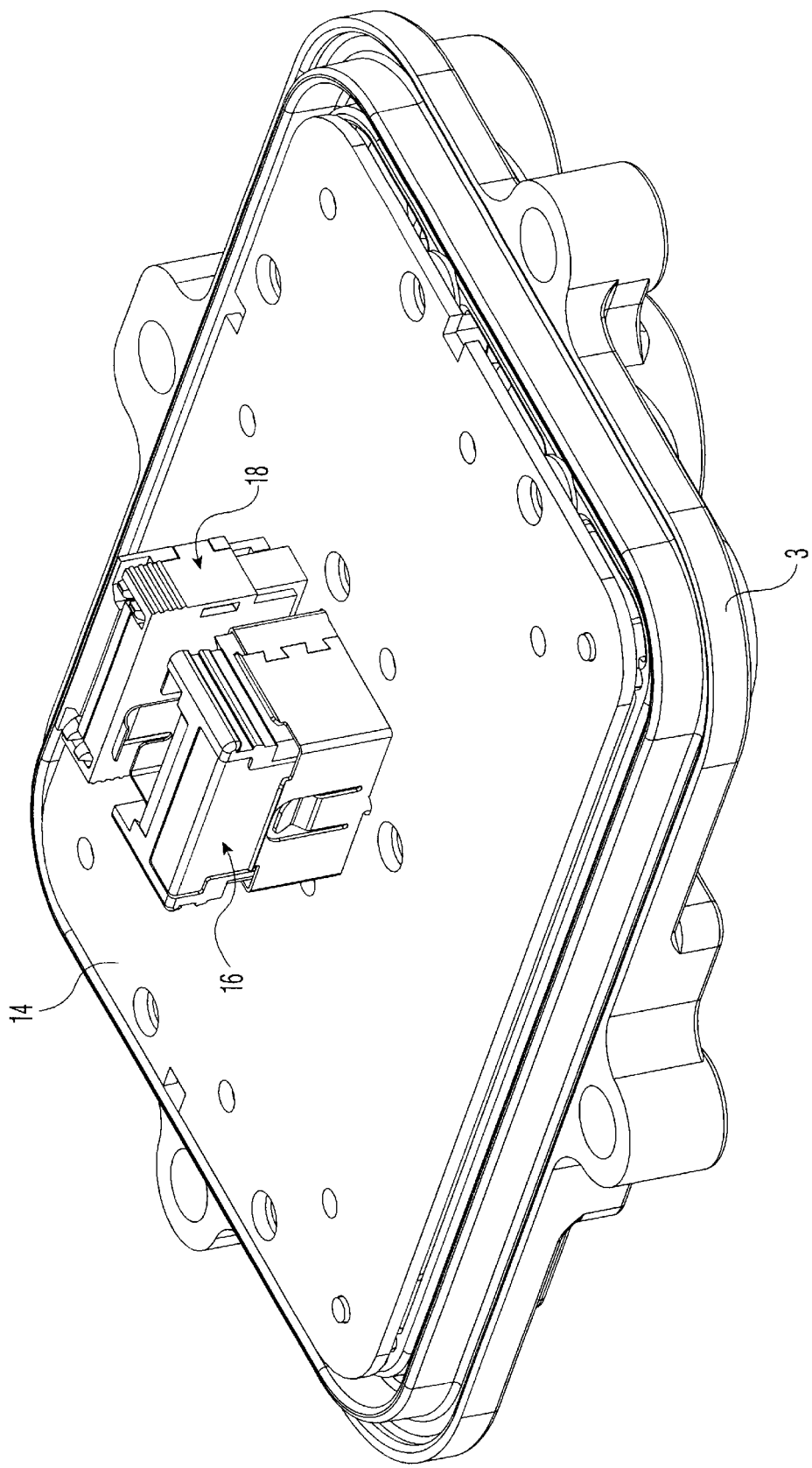
FIG. 2 is a pictorial view of the top face of a printed circuit (PC) board mounted on the inside face of a multi-tap tap plate, showing two plug-in modules on the PC board for one embodiment of the invention, whereby one of the plug-in modules is a directional coupler that can alternatively in another embodiment of the invention be hardwired on the PC board, with only one plug-in module being provided for other functions.

In FIG. 2, for one embodiment of the invention, a pictorial view is shown of the top face of a printed circuit board (PCB) 14 mounted on the inside face of a multi-tap tap plate 3. For one embodiment of the invention, two plug-in modules 16 and 18 are shown. More specifically, plug-in module 16 is identified as a directional coupler plug-in module 16, and plug-in module 18 is identified as an equalization and/or filtering function plug-in module 18.

In a second embodiment of the invention, a directional coupler may be hardwired to the printed circuit board 14 for providing on a given PCB 14 a desired level of attenuation for the signals tapped off to the subscribers, and the plug-in module 18 is retained for facilitating the selection of desired equalization and/or filtering functions by selecting the desired plug-in module 18 from a plurality of such plug-in modules 18 all offering differing functional characteristics. Similarly, in the second embodiment of the invention, the multi-tap system also includes a plurality of tap plates 3 with different numbers of subscriber tap ports, and also with different respective levels of directional coupling wired onto the associated PCB 14. In this embodiment and all other embodiments of the present invention, the tap plate 3 and its associated PCB 14 are configured for direct substitution of tap plates presently in use, whereby the old tap plate 3 is removed with its associated PCB, and the appropriate tap plate 3 with PCB 14 of this and other embodiments of the invention, as desired, is substituted. A user first selects a tap plate 3 having a desired number of subscriber tap ports, and a desired level of directional coupling. The user then next selects the one of the plug-in modules 18 providing the necessary equalization and/or filtering desired, for example.

Figure 3:
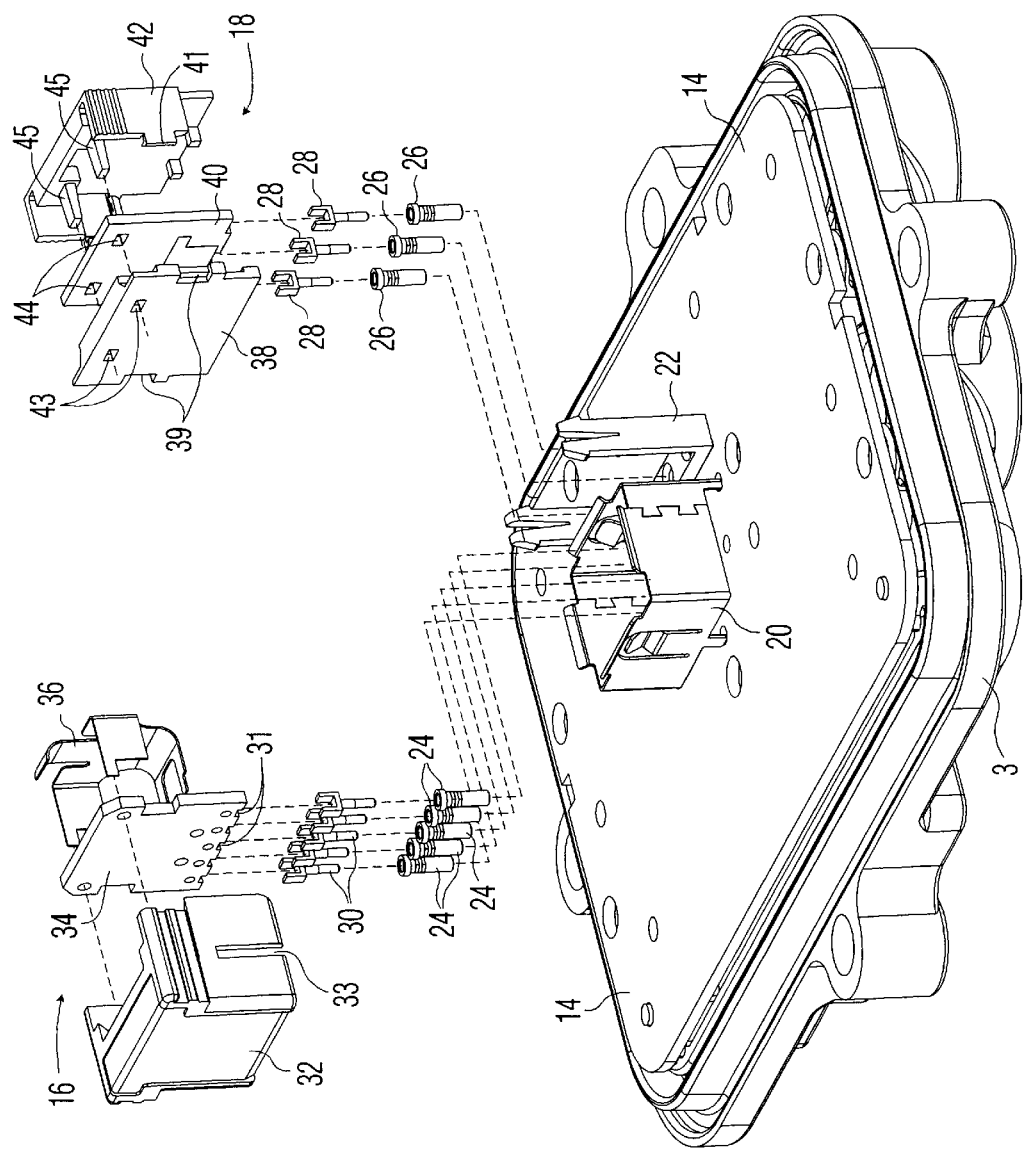
FIG. 3 is a pictorial exploded assembly view of the embodiment of FIG. 2.

In FIG. 3, an exploded assembly diagram is shown of the embodiment of the invention of FIG. 2. The directional coupler plug-in module 16, as shown, includes an associated RF shield 20 mounted on the PCB 14, and a plurality of female pin connector receptacles or sockets 24 also mounted on the PCB 14, for receiving a plurality of male pin contacts 30, respectively, of the actual plug-in module 16 itself. The plug-in module 16 further includes a front section 32, a printed circuit board 34 containing the circuitry for the directional coupling function, and an RF shield 36. The male pins 30 are mounted onto slots 31 (typically by soldering) for electrical connection to the PCB 34. Note that although not clearly shown in FIG. 3, a front section 32 includes a slot 33 for receiving an edge portion of the PCB 34, whereby a similar slot 33 is located on the opposing side of front section 32 for receiving the opposing edge portion of PCB 34. Reference is also made to FIGS. 7A through 7E, showing top, bottom, front, back, and side views of the plug-in module 16.

A retainer bracket and guide 22 is mounted on the PCB 14 for receiving the plug-in module 18. A plurality of female pin connector receptacles or sockets 26 are mounted on the PCB 14 for receiving male pin contacts 28 of the plug-in module 18. The plug-in module 18 includes a back section 38, a printed circuit board 40 containing the circuitry for providing the desired equalization and/or filtering, or other desired functions, and a front section 42. Retention slots 43 are provided on back section 38, and retention slots 44 are provided on PCB 40 for receiving the retention tabs 45 to help secure the three pieces together. Also assisting in securing the plug-in module 18 components together are retention tabs 41 on the front section 42 which are secured in side retention slots 39 of the back section 38. The male pin contacts 28 are secured to the PCB 40, typically by crimping and/or soldering. Reference is also made to FIGS. 6A through 6E, showing top, bottom, front, back, and side views of the assembled plug-in module 18, which is the same as a plug-in module 19 of another embodiment of the invention to be discussed below.

Figure 4:
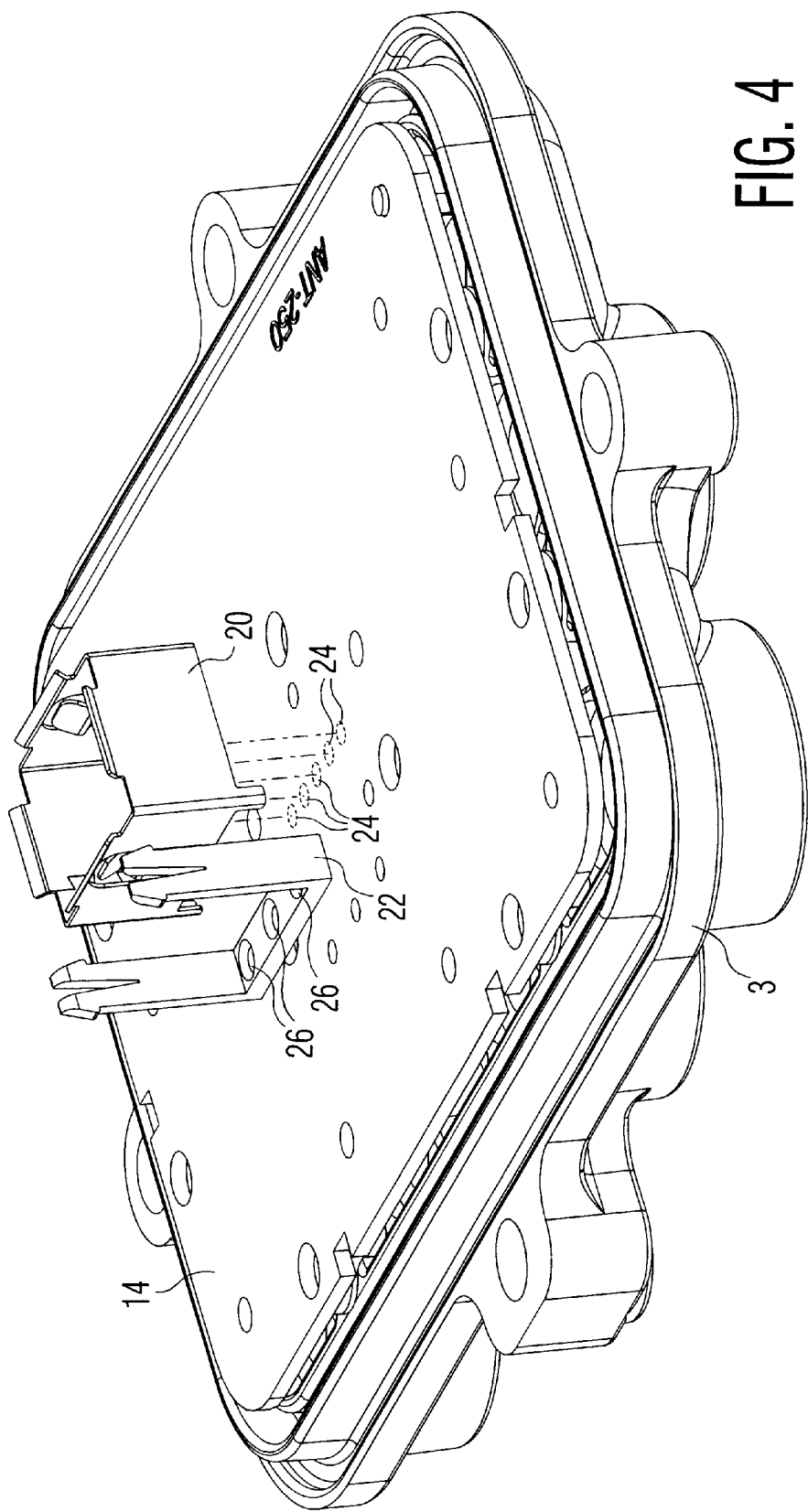
FIG. 4 is a pictorial view of the embodiment of FIGS. 2 and 3, showing first and second receptacles on the PC board for receiving the plug-in modules which are absent.

In FIG. 4, a tap plate 3 with PCB 14 of the embodiment of the invention of FIGS. 2 and 3 is shown absent the plug-in module 16, and the plug-in module 18. This pictorial view provides a clearer view of the RF shield 20 for the directional coupler plug-in module 16, as well as the actual placement of the female sockets 24. Similarly, the configuration of the retainer bracket 22 is more clearly shown, as is the placement of the female sockets 26.

Figure 5:
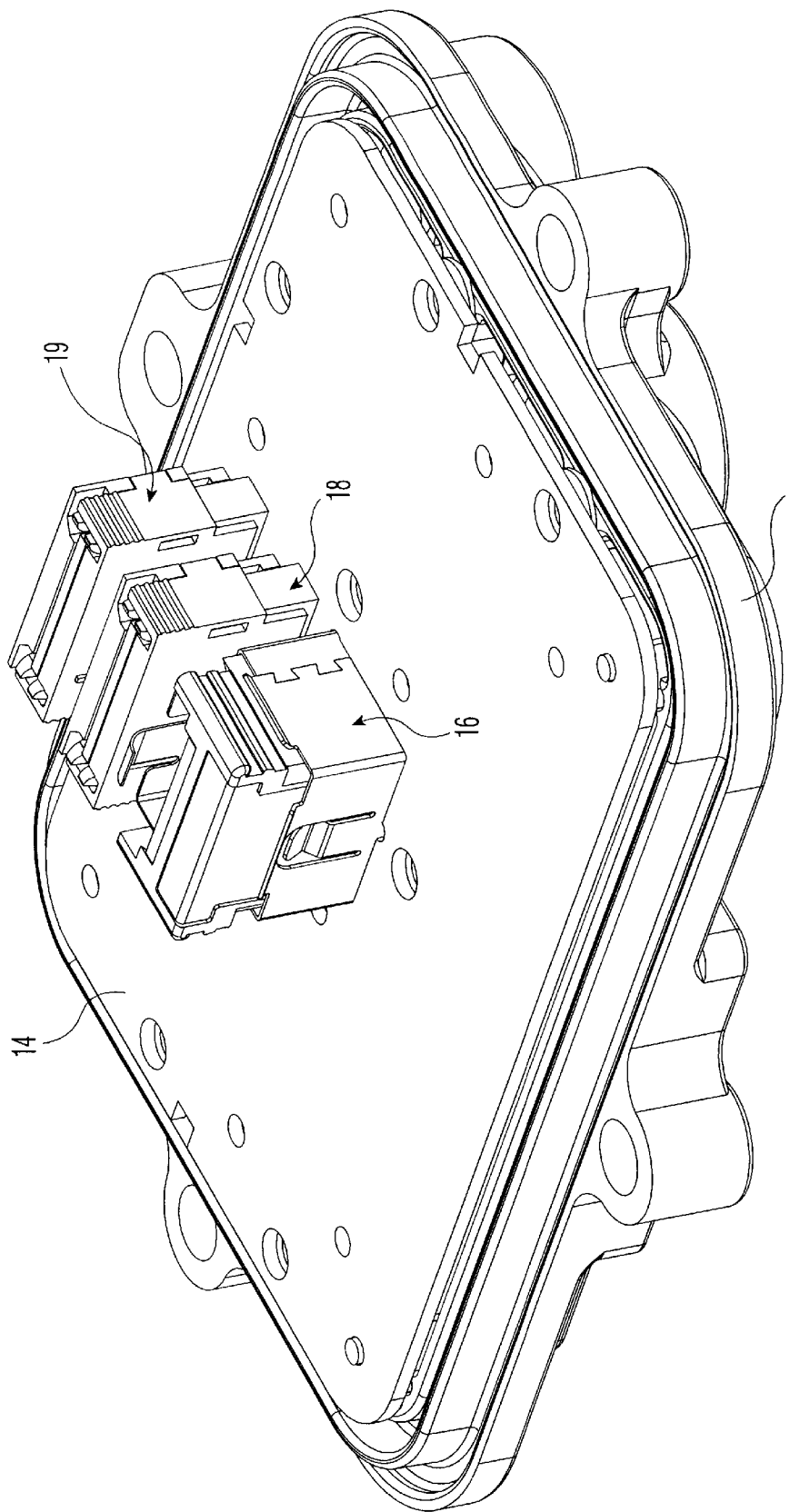
FIG. 5 is a pictorial view of a third embodiment of the invention incorporating three plug-in modules.
Figure 6A:
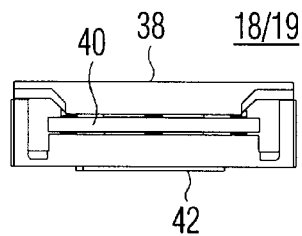
FIGS. 6A through 6E show top, bottom, front elevational, back elevational, and side elevational views, respectively, of a functional plug-in module for one embodiment of the invention.
Figure 6B:
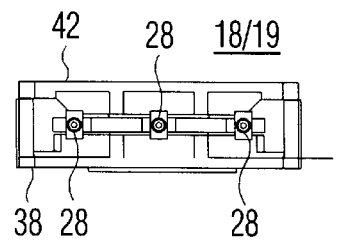
Figure 6C:
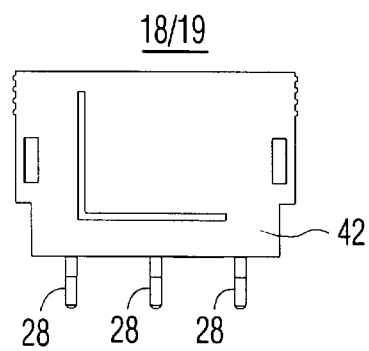
Figure 6D:
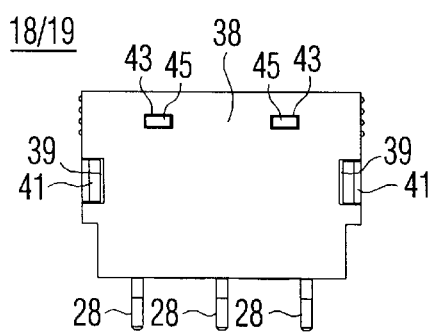
Figure 6E:
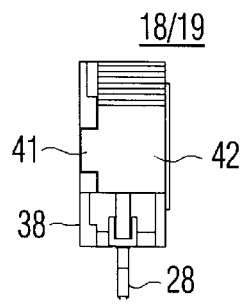
Figure 7A:
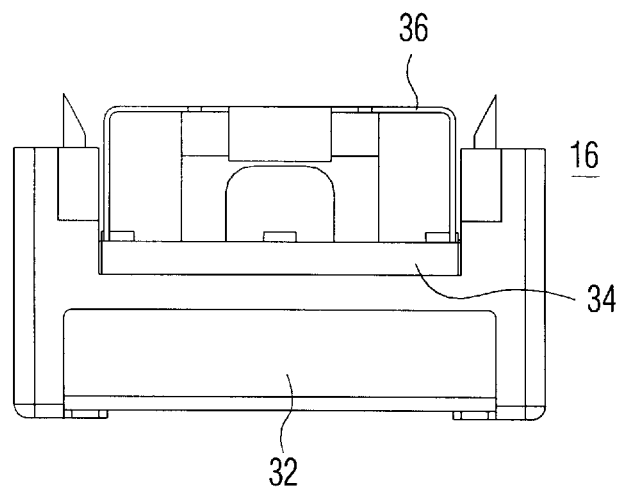
FIGS. 7A through 7E show top, bottom, front elevational, back elevational, and side elevational views, respectively, of a plug-in module for providing a directional coupler for one embodiment of the invention.
Figure 7B:
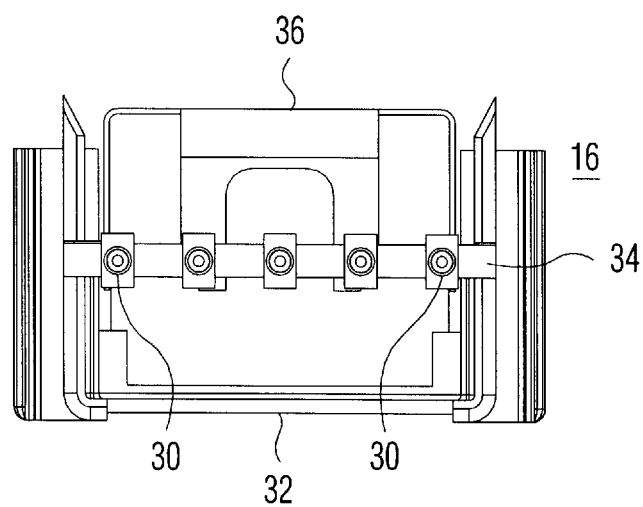
Figure 7C:
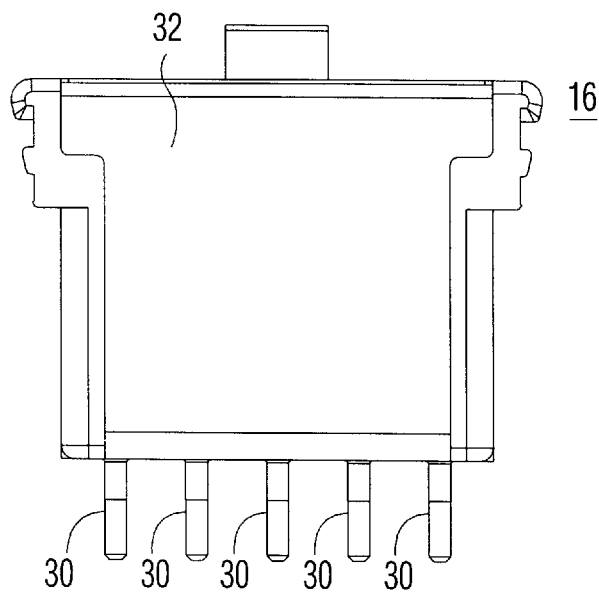
Figure 7D:
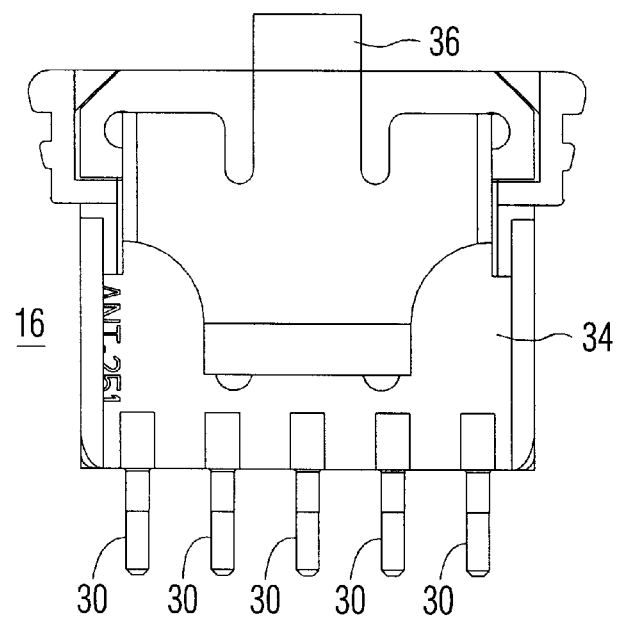
Figure 7E:
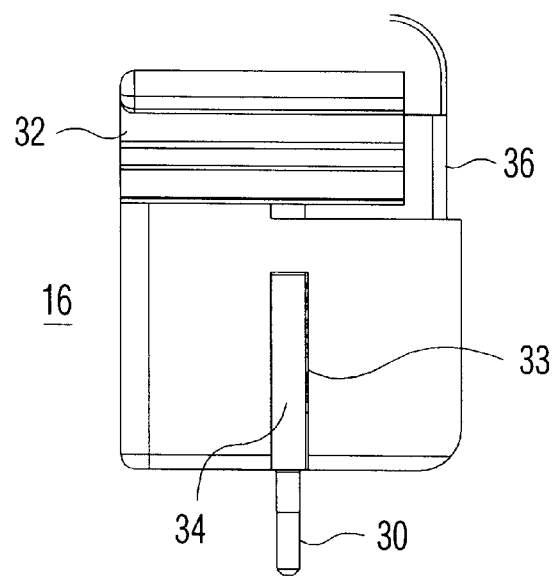

FIG. 5 shows a pictorial diagram of a third embodiment of the invention including a directional coupler plug-in module 16, a first equalization and/or filtering or other function plug-in module 18, and a second functional plug-in module 19 providing functions similar to those of plug-in module 18, but at any given time each provides a different function. This third embodiment of the invention provides even greater flexibility to the user than the first and second embodiments of the invention, as will be described in further detail below.

Figure 8:
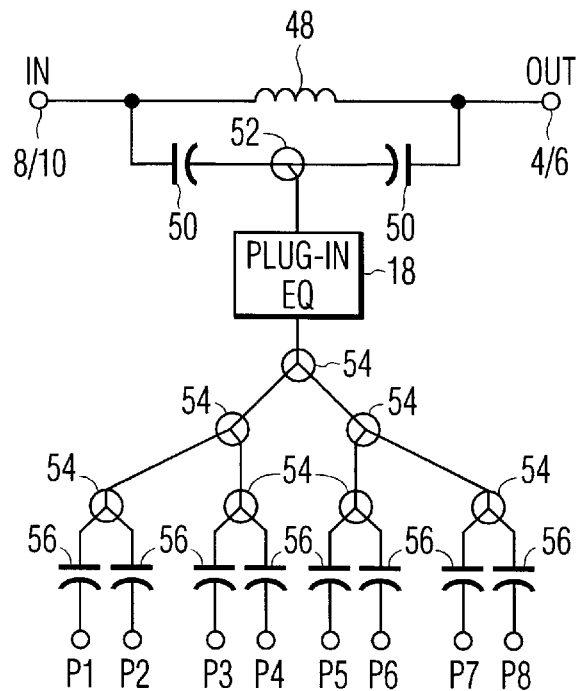
FIG. 8 shows a circuit schematic diagram of a first embodiment of the invention including a directional coupler hardwired to a PC board, in combination with a receptacle for receiving plug-in modules for providing other functions, on a given tap plate.

As previously mentioned, in a second embodiment of the invention, a directional coupler is hardwired on the PCB 14, and a plug-in module 18 is also provided for equalization and/or filtering, or some other desired function. A circuit schematic and block diagram of the second embodiment of the invention is shown in FIG. 8, for use in an eight way tap configuration. As shown, an inductor 48 is wired between the input ports 8/10, and output ports 4/6, in this example. In parallel with the inductor 48 are two RF bypass capacitor 50 connected in series with a directional coupler circuit 52. The output of the directional coupler 52 is connected via a receptacle (not shown) to a plug-in module 18 providing equalization, and/or noise filtering, or perhaps some other function. The output from the plug-in module 18 is connected through a series of two-way splitters 54, in this example, for delivering tap off signals to subscribers through RF bypass capacitors 56 to tap ports P1 through P8, respectively, as shown.

Figure 9:
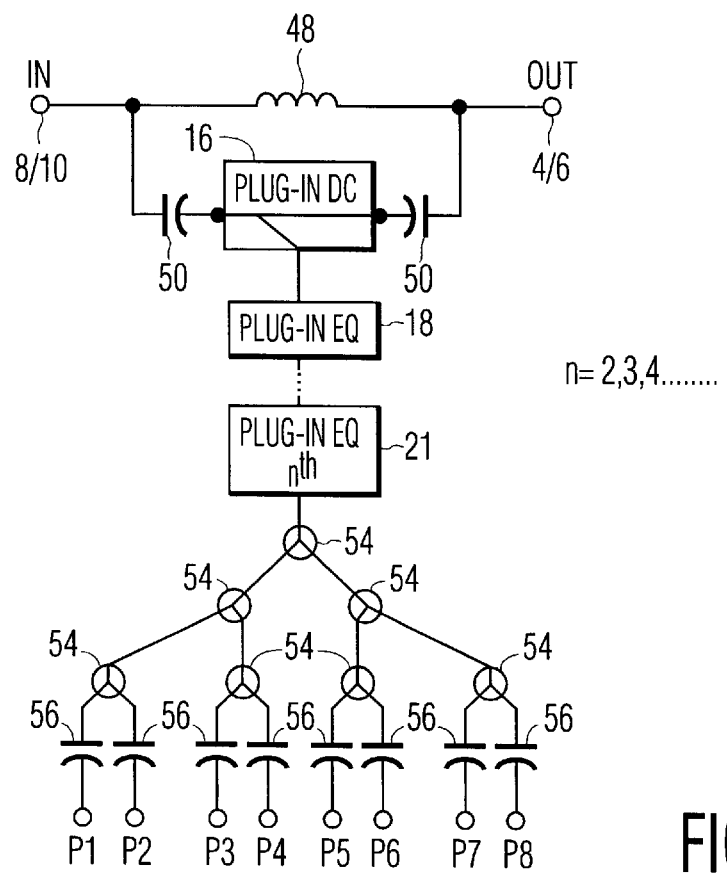
FIG. 9 shows a circuit schematic diagram for second through nth embodiments of the invention, including on the PC board of a tap plate a plug-in directional coupler, and a plurality of plug-in devices for providing other functions, respectively.

In FIG. 9 the embodiment of the invention of FIG. 8 has been expanded to show the first, and third through n embodiments of the invention for including to a practical limit the first plug-in module 16 for providing a directional coupler, with the addition of at least the second plug-in module 18 for providing two plug-in modules 16 and 18, as described above for the first embodiment of the invention. The first embodiment is expanded as shown in FIG. 9 to further include n plug-in modules (n=2,3,4 . . . ), with each of the additional plug-in modules 21 providing some desired function or functions such as equalization, filtering, and so forth.

Figure 10:
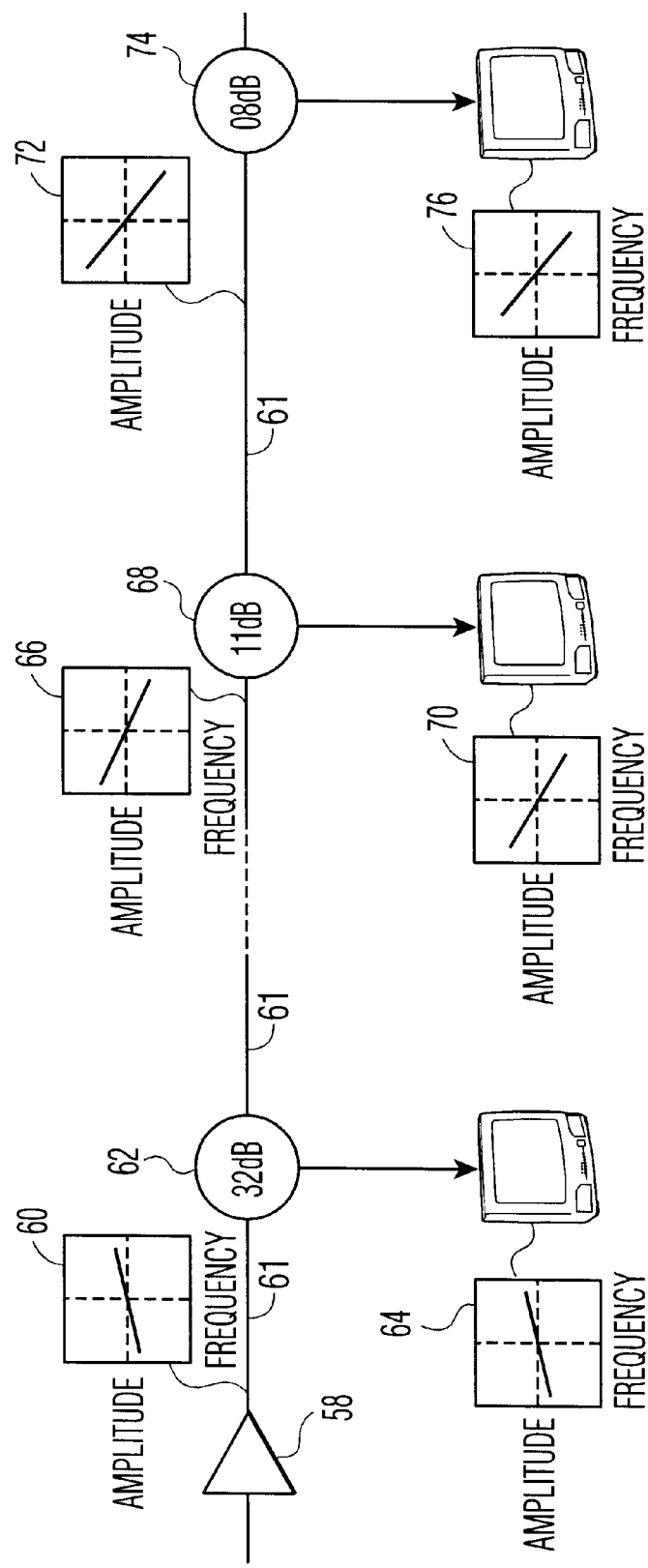
FIG. 10 shows a simplistic block schematic diagram of a prior conventional cable television distribution system including an amplifier, and a plurality of multi-taps, along with an example of typical frequency response curves at various points in the system.

In FIG. 10, a cable television distribution system as known in the art is shown. An amplifier 58 at the headend of the system drives a main cable 61 connected to a plurality of remote multi-taps represented in this example by multi-taps 62, 68, and 74, respectively, for providing 32 dB, 11 dB, and 8 dB, attenuated tap off of signals, respectively, for delivery to subscribers. The frequency response curves or "tilt" curves 60, 66, and 72, show the tilt that may be encountered at various points in the distribution system between the amplifier 58 and multi-tap 62, multi-tap 62 and multi-tap 68, multi-tap 68 and multi-tap 74, respectively, in this example. The tilt or frequency response at the subscriber locations is shown by tilt curve 64 for multi-tap 62, tilt curve 70 for multi-tap 68, and tilt curve 76 for multi-tap 74. As illustrated, excessive tilt is experienced by subscribers connected to multi-taps 68 and 74, to such a degree that the high frequency channels are excessively attenuated, causing the quality of the high frequency channels received by the associated subscribers to be diminished.

Figure 11:
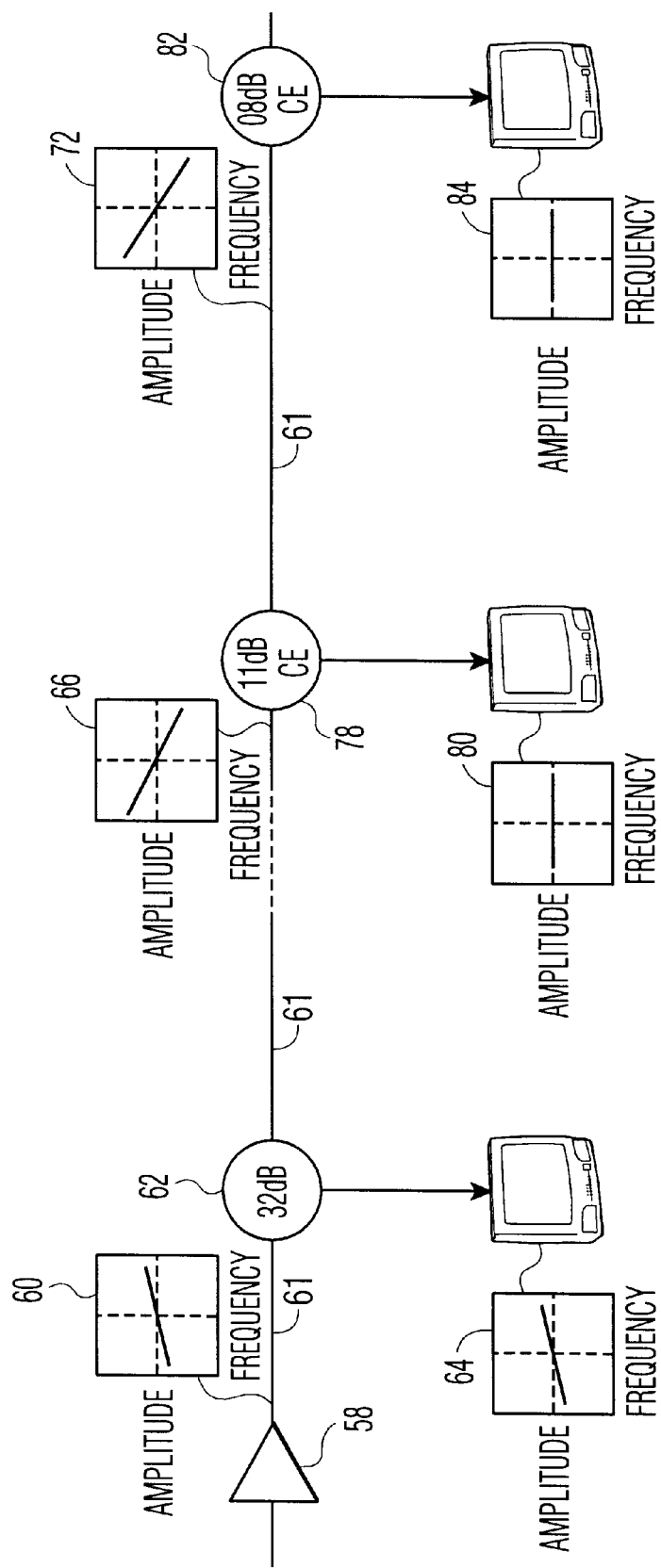
FIG. 11 shows a simplistic block diagram of a cable television distribution system incorporating various embodiments of the invention, with examples of the improved frequency response obtained at subscriber locations in comparison with the conventional system of FIG. 10.

In FIG. 11, one embodiment of the invention is shown for correcting the tilt problem illustrated in FIG. 10 in conventional multi-tap applications. As shown, the tilt is corrected by including cable equalizers in the multi-taps 78 and 82, in substitution of the former multi-tap 68 and 74. The improved performance is shown in response curve 80 for the subscribers to multi-tap 78, and a response curve 84 for the subscribers to multi-tap 82, whereby the frequency response is substantially flat, enhancing the quality of the high frequency channels. Note that as previously mentioned, this embodiment of the invention can be provided by removing the conventional tap plates from the multi-taps 68 and 74, and replacing them with tap plates 3 of the present invention incorporating either a hardwired directional coupler or a plug-in module 16 for the same, and a plug-in module 18 for providing the cable equalization function. The plug-in module 18 for providing the cable equalizer function includes a full bandwidth equalizer circuit to equalize the entire band from 5 to 1000 megahertz (MHz). In this manner, the cable television distribution system is provided with full equalization from 5 to 1000 MHz independent of the return path bandwidth or split. The cable equalizer circuit utilized also tightens the window of the return path signal variation to allow more efficient operation of return transmitters and optical nodes. A preferred cable equalizer circuit is shown in FIG. 12 for use in the plug-in module 18.

Figure 12A:
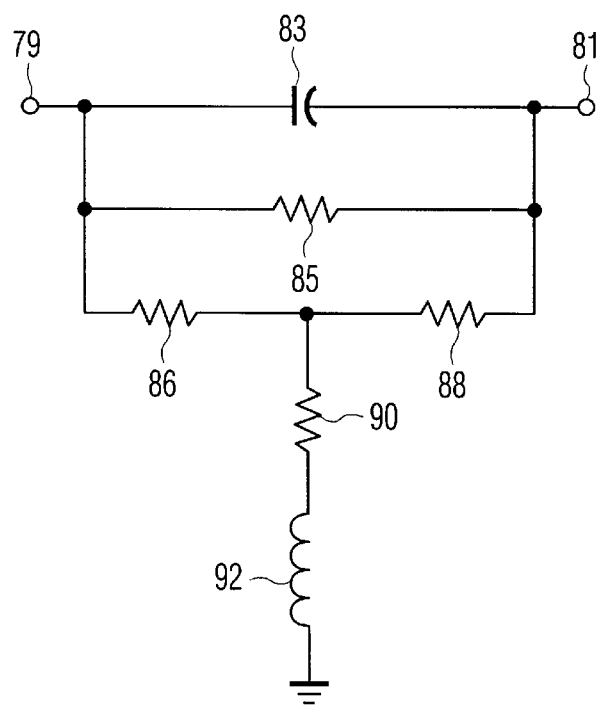
FIG. 12A shows a circuit schematic diagram of a cable equalizer plug-in device or module for one embodiment of the invention.
Figure 12B:
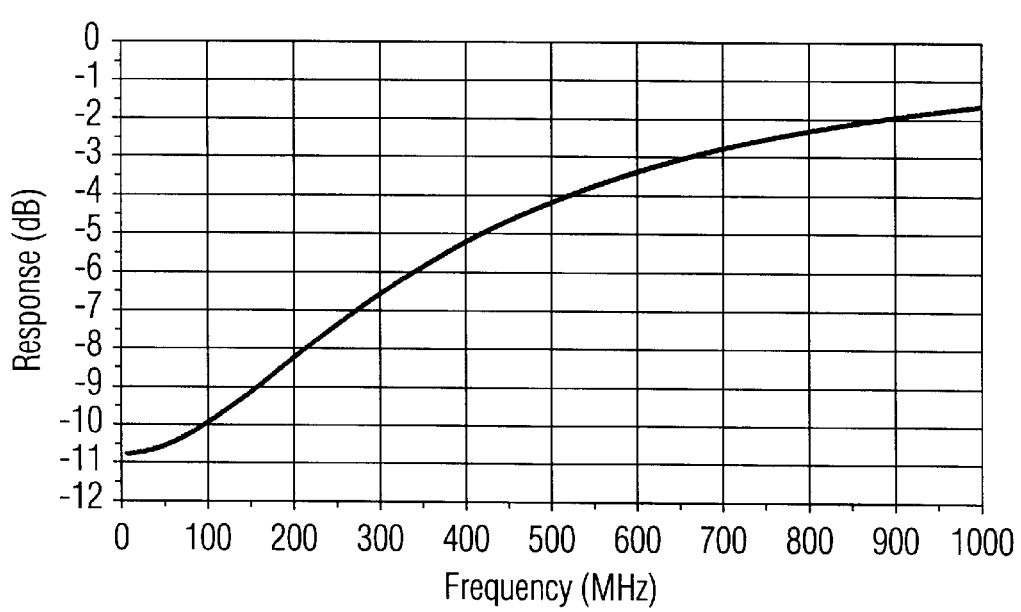
FIG. 12B shows a typical frequency response curve for the circuit of FIG. 12A.

With further reference to the circuit schematic diagram for a preferred cable equalizer circuit as shown in FIG. 12A, the parallel combination of a capacitor 83 and resistor 85 is connected between a first connection point 79, and a second connection point 81, as shown. The series connection of two resistors 86 and 88 are connected in parallel with capacitor 83 and resistor 85. The common connection between resistors 86 and 88 is connected to one end of a resistor 90 connected in series with an inductor 92 terminated to a source of reference potential, ground in this example. The component values are dependent upon the dB value desired for a given cable equalizer plug-in module 18. For example, sixteen different cable equalizer plug-in modules can be provided for providing sixteen different levels of equalization. Note that FIG. 12B shows an example of a desired frequency response curve for the circuit of FIG. 12A. In summary, through use of this embodiment of the invention, the cost incurred in a cable television distribution system for extending the reach of each associated amplifier 58 to remote subscribers is reduced through use of the a cable equalizer circuit in a plug-in module 18, for equalizing the excessive cable tile at the subscriber ports, as described above.

Figure 13:
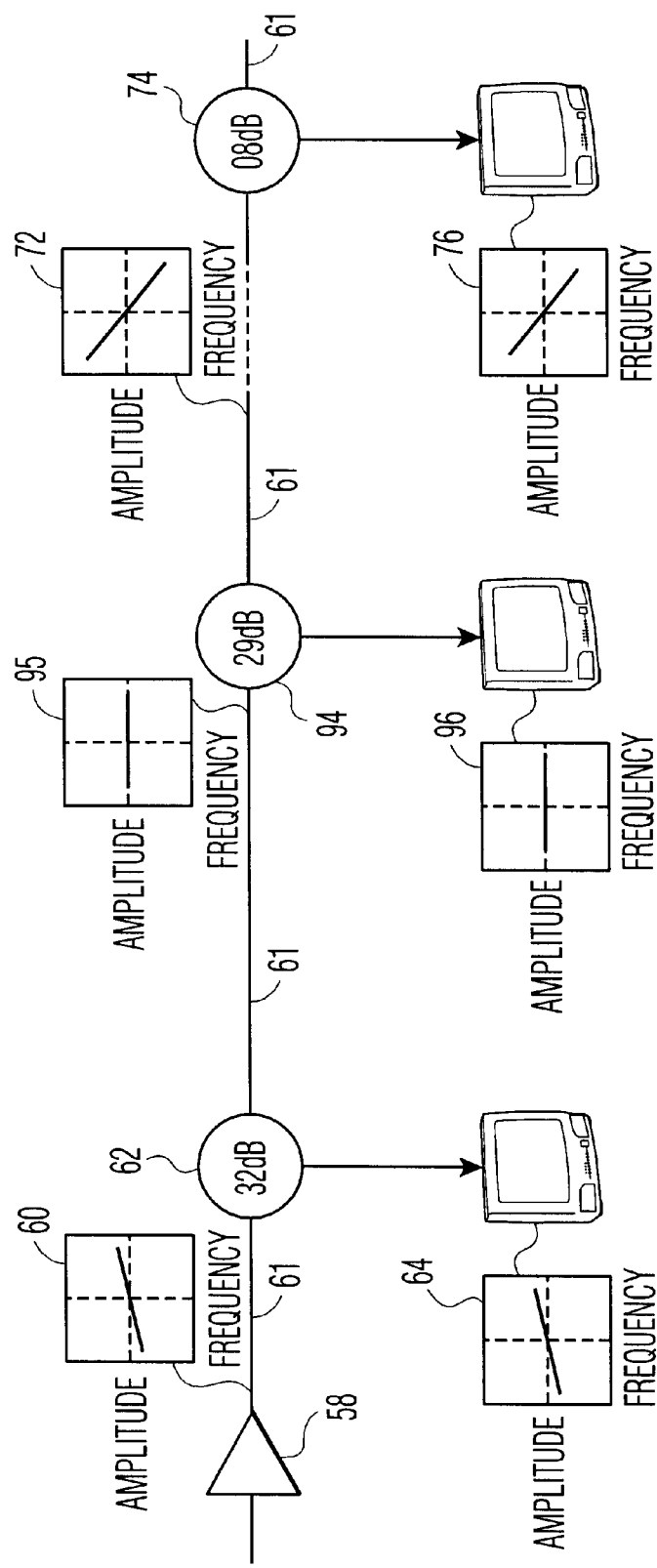
FIG. 13 shows a prior conventional cable television system incorporating a plurality of multi-taps, with the frequency response curves at various points in the system being shown, with emphasis on the excessive tilt that results from cable loss at a subscriber location near the end of a long cable.

With reference to FIG. 13, a known conventional cable television distribution system is shown to include an amplifier 58 driving a 32 dB multi-tap 62, 29 dB multi-tap 94, and 8 dB multi-tap 74. An example of the typical frequency response or tilt is shown by tilt curve 60 between amplifier 58 and multi-tap 62, tilt curve 95 between multi-tap 62 and multi-tap 94, and tilt curve 72 between multi-tap 94 and multi-tap 74. The tilt curves 64, 96, and 76, show the tilt experienced at subscriber locations for multi-taps 62, 94, and 74, respectively. As shown in this example, the subscriber connected to multi-tap 74 experiences excessive tilt from cable loss, causing the quality of the high frequency channels to be substantially reduced. The reach of the system shown is limited through use of the conventional tilt of the amplifier 58 in view of the FCC specifications for permissible tilt at a subscriber port.

Figure 14:
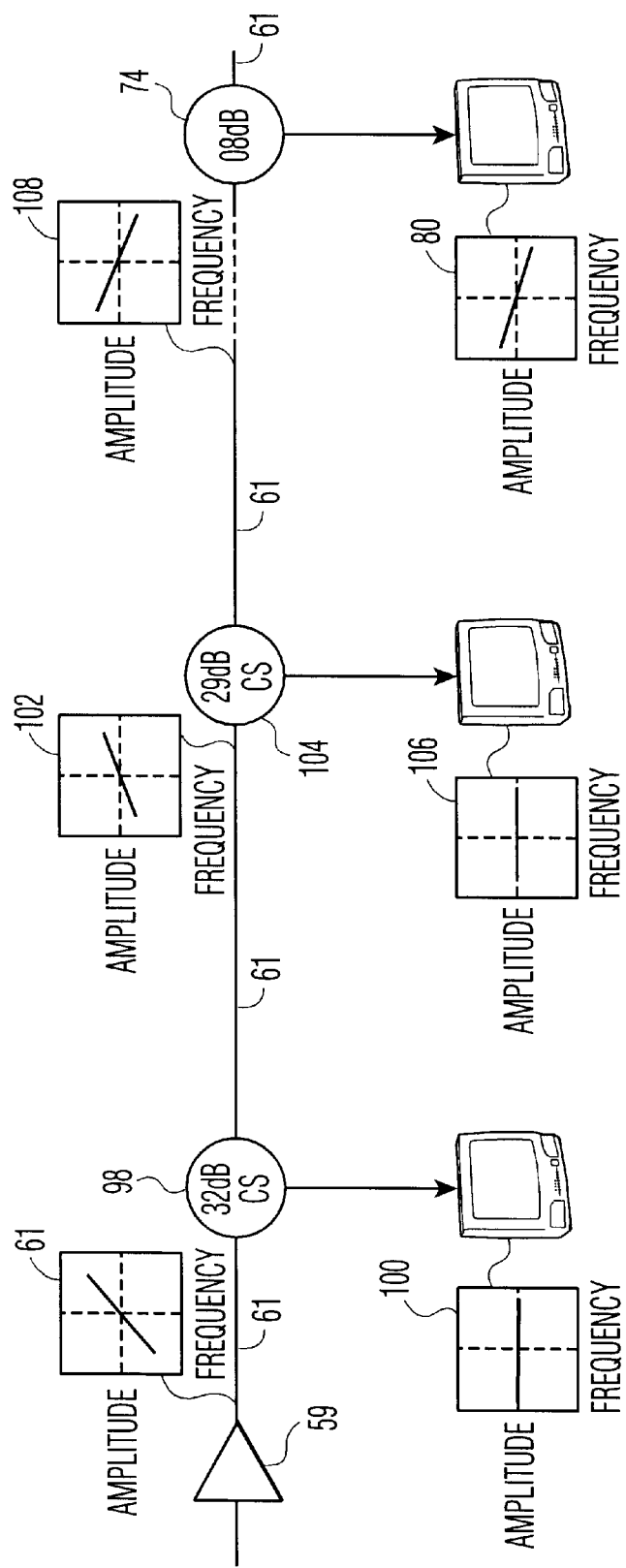
FIG. 14 shows a cable television distribution system for an embodiment of the invention incorporating multi-taps having cable simulators for overcoming the excessive tilt problem of the conventional system, such as shown in FIG. 13.

The problems in the prior art relative to FIG. 13 are corrected in the present invention as shown in FIG. 14. The multi-taps 62 and 94 of the prior system are converted or replaced to provide multi-taps 98 and 104, each of which include cable simulators in an associated plug-in module 18. Also, the pretilt of the amplifier 59 at the headend is intentionally increased to extend the range of the line. This is shown in the frequency response or tilt curve 61, where the high frequency channels have been successively tilted upward in amplitude relative to the lower frequency channels. In this example, through use of the aforesaid pretilt, and the cable simulators in multi-taps 98 and 104, the frequency response curves 100 and 106, at subscribers of multi-taps 98 and 104, respectively, show substantially flat response. Also, the remote subscriber connected to multi-tap 74 has greatly improved tilt or frequency response as shown in tilt curve 80. Note that the cable simulator plug-in filter provided by a plug-in module 18 is installed in only a few taps 98 and 104 directly after the amplifier 59, for providing enhanced response to additional subscribers located downline of the multi-tap 104, with an improvement being obtained even by the remotest subscriber at the end of the main cable 61.

Figure 15A:
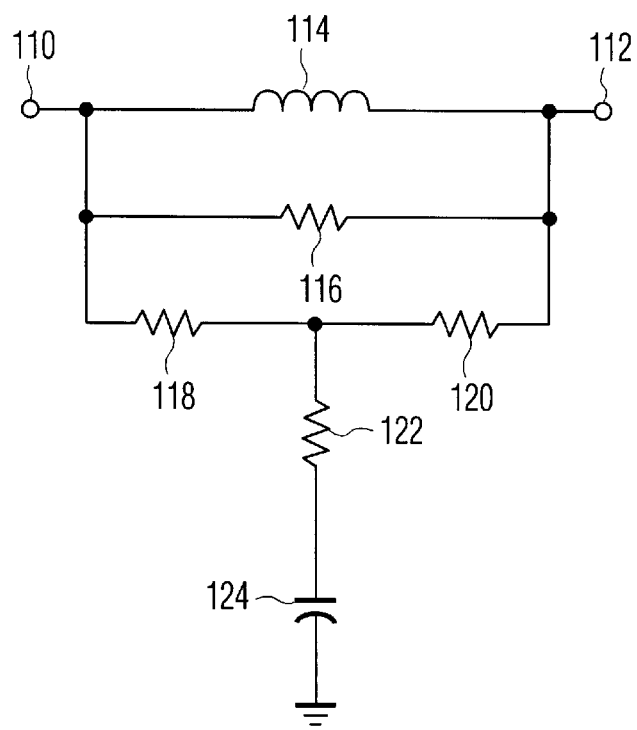
FIG. 15A shows a circuit schematic diagram of a cable simulator for a plug-in device for one embodiment of the invention.
Figure 15B:
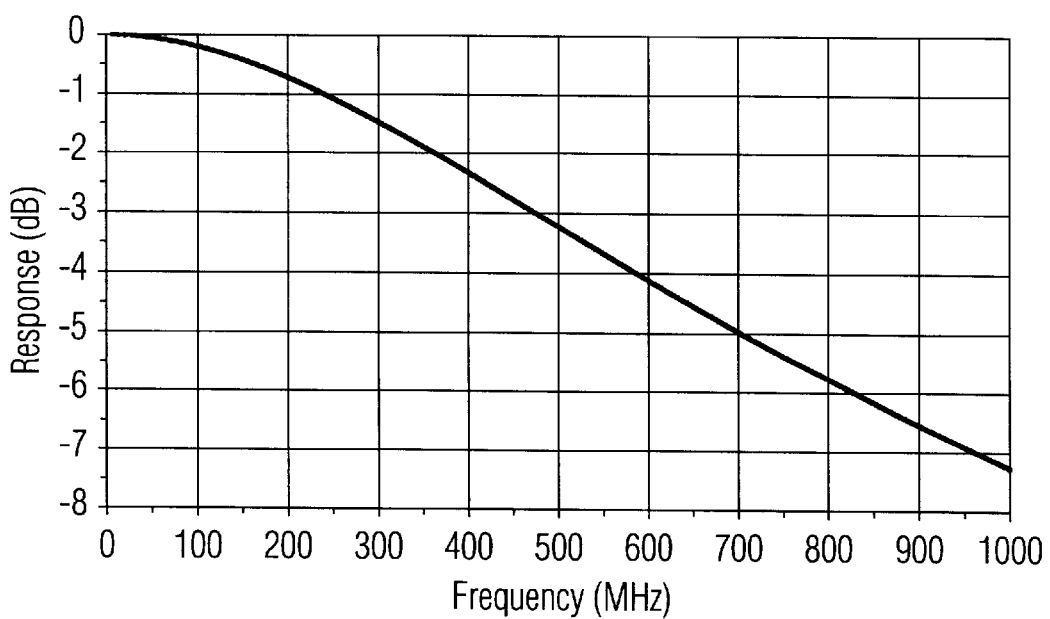
FIG. 15B shows a typical frequency response curve for the circuit of FIG. 15B.

The circuit schematic diagram for a preferred cable simulator circuit for use in a plug-in module 18 providing the cable simulation as described for FIG. 14, is shown in FIG. 15A. As shown, the circuit includes an inductor 114 connected in parallel with a resistor 116, and further in parallel with a series connection of resistors 118 and 120, between connection terminals 110 and 112. The common connection between series resistors 118 and 120 is connected to one end of a resistor 122 connected in series with a capacitor 124 terminated to a source of reference potential, ground in this example. The values of the various components of the cable simulator circuit are adjusted for obtaining the desired dB level of performance. FIG. 15B shows an example of a desired frequency response curve for the 11 circuit of FIG. 15A. As previously described, the cable simulator function is provided in a plug-in module 18 in applications where there is a large positive tilt in the output of amplifiers at the headend, such as amplifier 59, in combination with very low cable loss between the amplifier 59 and the first few multi-taps. Also, the cable simulator plug-in module 18 provides improved response in systems containing high output level GaAs rf Amplifiers and optical nodes. The cable simulator plug-in module 18 substantially maintains low signal loss in the return drop path, while at the same time attenuating the forward drop signals to the proper system levels for enhancing a performance of the distribution system.

Figure 16:
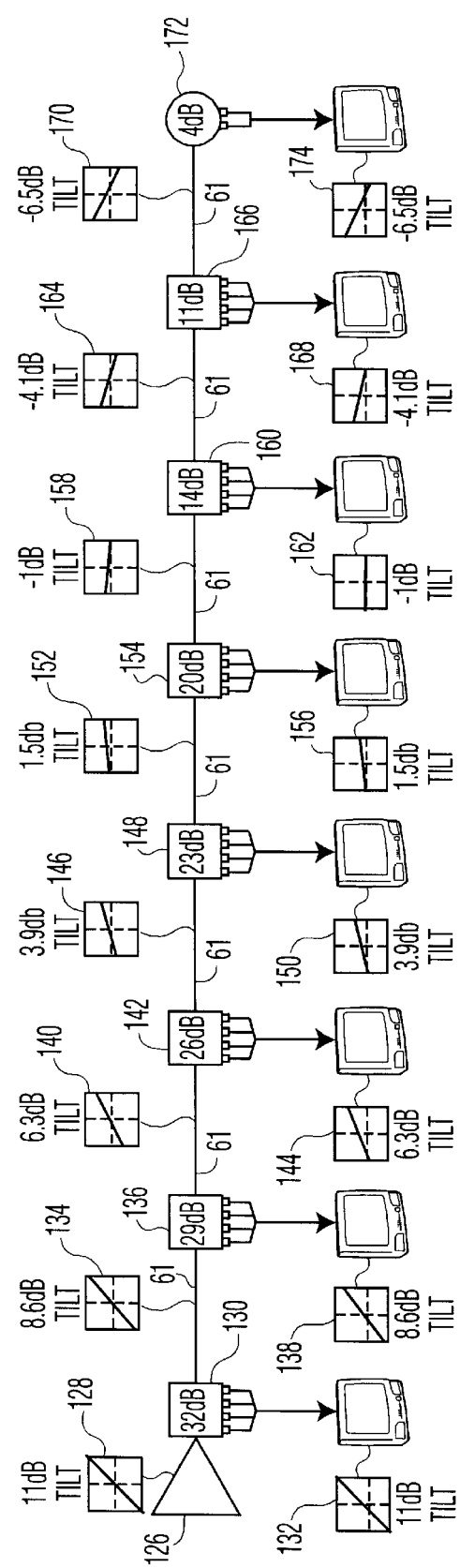
FIG. 16 shows a block diagram of a prior conventional cable television distribution system including a plurality of multi-taps, with the tilt obtained at various portions of the system example given, particularly highlighting the excessive tilt produced at various ones of the subscribers locations.

In FIG. 16 a block diagram is shown of a conventional cable television system that includes at the headend an amplifier 126 driving a plurality of multi-taps 130, 136, 142, 148, 154, 160, 166, and 172, respectively, connected at various points along the main cable 61. The tilt obtained in this example between multi-taps 130 and 136, 136 and 142, 142 and 148, 148 and 154, 154 and 160, 160 and 166, 166 and 172, is shown by tilt curves 134, 140, 146, 152, 158, 164, and 170, respectively. The tile experienced by subscribers connected to multi-taps 130, 136, 142, 148, 154, 160, 166, and 172, are shown by tilt curves 132, 138, 144, 150, 156, 162, 168, and 174, respectively. As shown, extremely excessive tilt is experienced by subscribers at subscriber locations represented by tilt curves 132, 138, 144, and 174, respectively. This problem is representative of systems utilizing amplifiers that have large gains and tilts, as shown by tilt curve 128 for amplifier 126.

Figure 17:
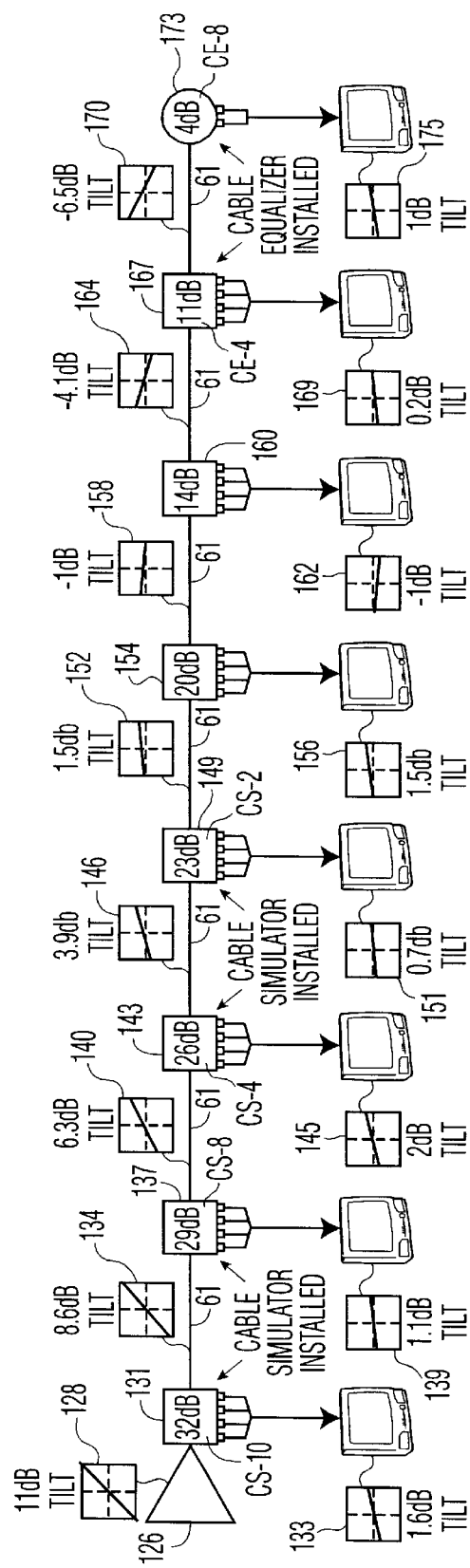
FIG. 17 shows a block schematic diagram of a cable television distribution system including a plurality of multi-taps of the present invention incorporating cable simulator and cable equalizer plug-in devices for overcoming the conventional system illustrated in FIG. 16.

The problems of excessive tilt in the cable distribution system shown in FIG. 16 of the prior art is corrected in the present invention, as shown in FIG. 17 through use of plug-in modules 18 providing specifically a 10 dB cable simulator plug-in module 18 in 32 dB multi-tap 131, an 8 dB cable simulator plug-in module 18 in 29 dB multi-tap 137, a 4 dB cable simulator plug-in module 18 in 26 dB multi-tap 143, and a 2 dB cable simulator plug-in modulate 18 in 2 dB multi-tap 149. A 4 dB cable equalizer plug-in module 18 is provided in 11 dB multi-tap 167, and an 8 dB cable equalizer plug-in module 18 in 8 dB multi-tap 173. As shown by the tilt curves 133, 139, 145, 151, 156, 162, 169, 175, the tilt at subscriber locations relative to multi-taps 131, 137, 143, 149, 154, 160., 167, and 173, respectively, are substantially improved. Note that in this example, and in other examples of cable distribution systems incorporating the present invention, the associated multi-taps along the main cable 61 are spaced approximately 100 feet apart.

Figure 18:
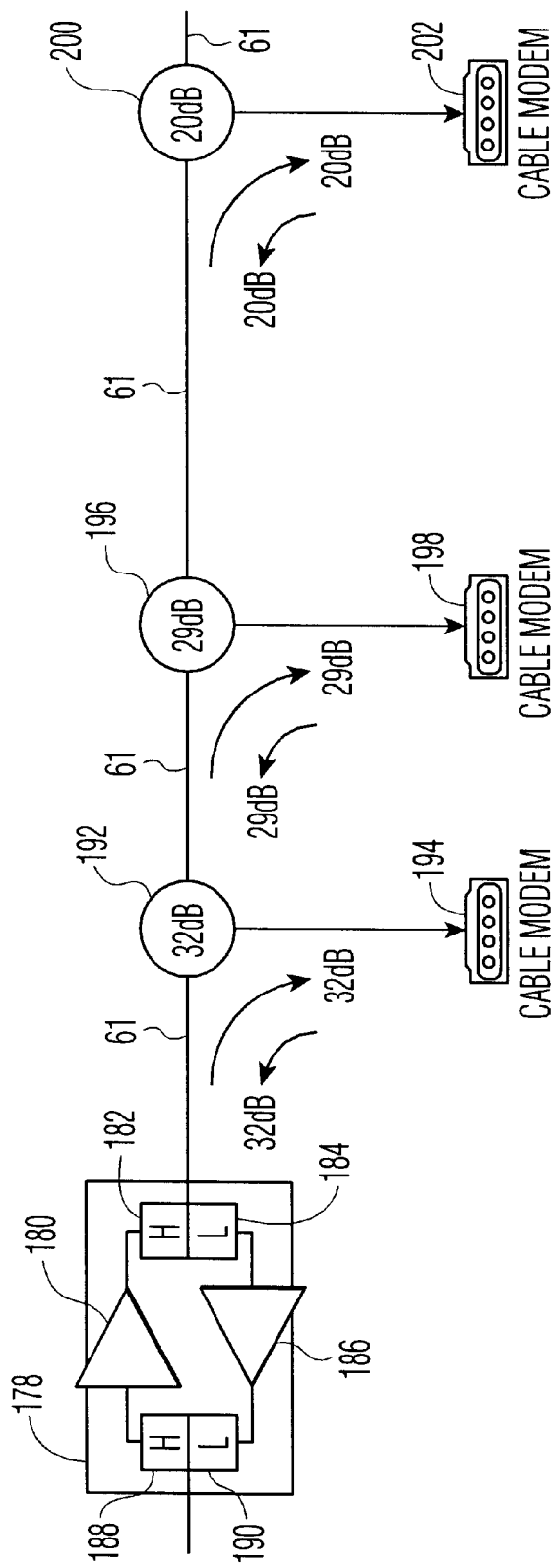
FIG. 18 shows a block schematic diagram of a prior conventional cable television distribution system including a plurality of multi-taps, with cable modems being located at various subscribers, in which system excessive return path signal loss is shown relative to return signals from the cable modem back to the main distribution cable.

In conventional cable television distribution systems cable modems cannot be used by subscribers at locations or households where a high tap loss value is occurring. The reason is that such high tap loss value reduces the level of the return signal from the associated cable modem to a level having a low carrier-to-noise ratio, preventing reliable transmission of the associated return signal. Such a conventional cable distribution system is shown for example in FIG. 18. The system includes a bidirectional amplifier module 178 at the headend, which module includes two oppositely directed amplifiers 180 and 186, high pass filters 182 and 188, and low pass filters 184 and 190, connected as shown. A 32 dB multi-tap 192, 29 dB multi-tap 196, and 20 dB multi-tap 200, are connected along the main cable 61 line as shown. Cable modems 194, 198, and 202 are connected at the subscriber locations to multi-taps 192, 196, and 200, respectively, as shown. It is typical that the return signals from cable modems 194 and 198 experience return path losses of 32 dB and 29 dB, respectively, as shown. It is typical that return path losses of greater than about 25 dB cause unreliable reverse path transmission. Note that the return path for multi-tap 200 does provide only a 20 dB return path loss. Note that the high value or large dB taps provided by multi-taps 192 and 196 are required in view of amplifier module 178 having a substantially high signal output level. Unfortunately, such high value multi-taps are not compatible with cable modems that typically have a limited output level, and this level is insufficient to overcome the high passive loss in the return path presented by the high level multi-tap. As a result, the return signal has a low carrier-to-noise/ingress figure, resulting in the unreliable operation.

Figure 19:
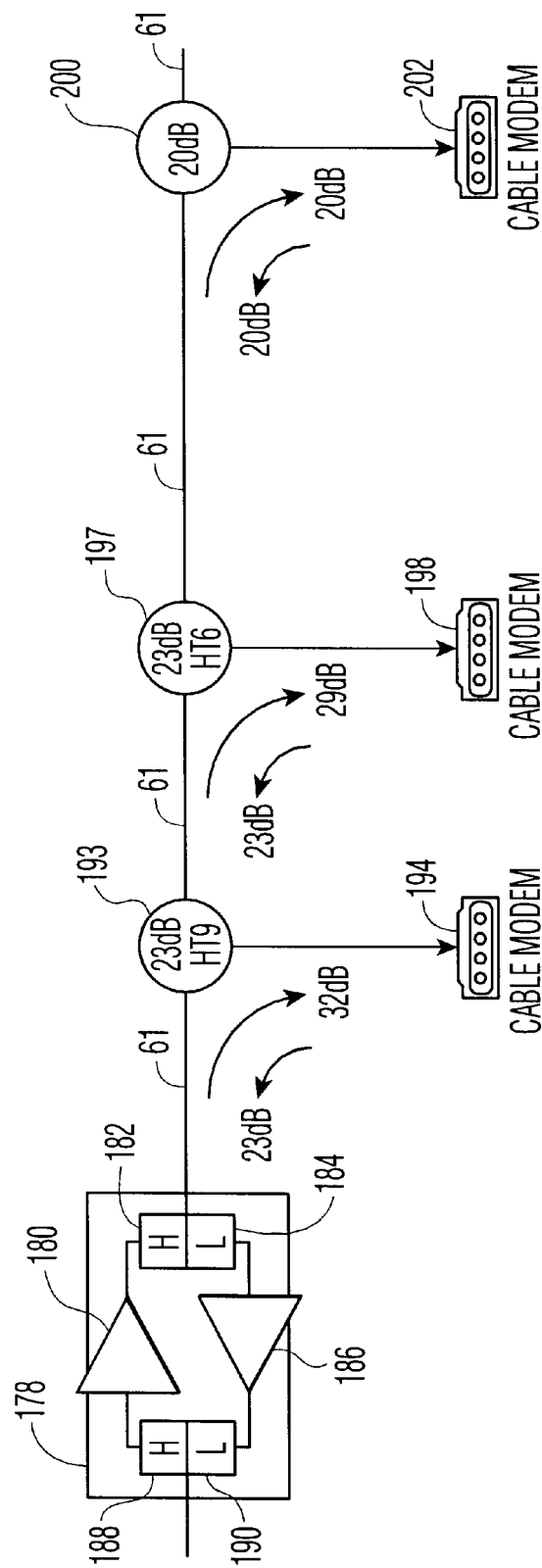
FIG. 19 shows a block schematic diagram of a cable television system including a plurality of multi-taps of the present invention including plug-in modules having high tap value filtering for reducing the return path lost relative to return signals from the cable modems to the return amplifier of the cable distribution system.

The present inventor recognized that in order to correct this problem, a plug-in module 18 must be provided with circuitry to reduce the attenuation in the return path in order to improve the carrier-to-noise/ingress figure for an associated cable modem return signal, in order to provide reliable operation. Through use of a high tap value filter in associated plug-in module 18, system performance is improved by permitting the use of high output amplifiers 178 for extending the length of the distribution system, while providing reliable cable modem service for return signals. The improved cable distribution system of the present invention is shown in FIG. 19 for incorporating the high output amplifier 178 in combination with a 23 dB multi-tap with a 9 dB high tap value plug-in 193, and 23 dB multi-tap with a 6 dB high tap value plug-in 197, each incorporating a high tap value plug-in filter in the plug-in module 18, respectively. As shown, the return signal of cable modem 194 has a return signal attenuation of 23 dB, as compared to 32 dB in the conventional system. Similarly, cable modem 198 now has a return signal attenuation of 23 dB as compared to 29 dB and the conventional system.

Figure 20A:
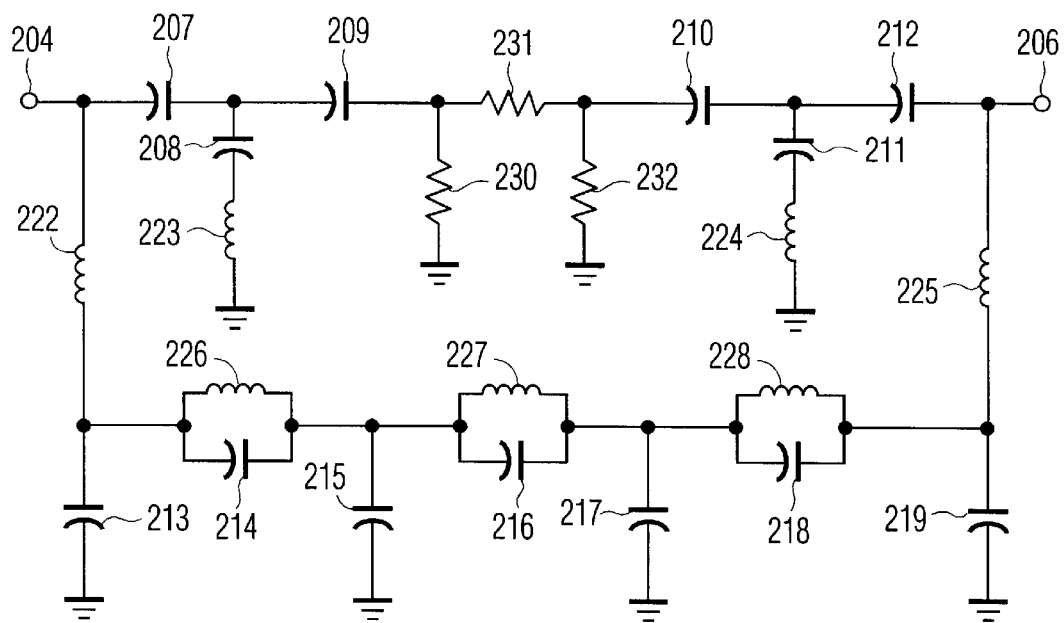
FIG. 20A shows a circuit schematic diagram of a high tap value (HT) plug-in module.
Figure 20B:
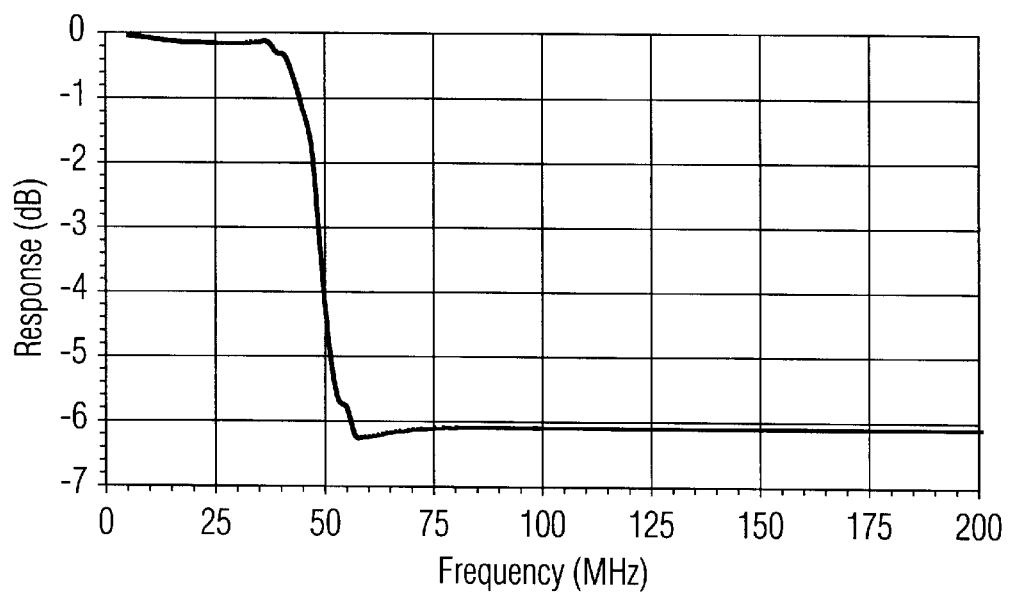
FIG. 20B shows a typical frequency response curve for the circuit of FIG. 20A.

A preferred high tap value circuit is shown in FIG. 20A for use in a plug-in module 18 for providing the high tap value filter function. The circuit includes as shown the series connection between connection terminals 204 and 206 successively of capacitors 207, 209, resistor 231, capacitors 210 and 212, respectively. The common connection between capacitor 207 and connection point or terminal point 204 is connected to one end of an inductor 222 connected in series with a capacitor 213 connected to a source of reference potential, ground in this example. The common connection between capacitors 207 and 209 are connected to the series connection of a capacitor 208 with an inductor 223 terminated to ground. The common connection between capacitor 209 and resistor 231 is terminated to ground via resistor 230. The common connection between resistor 231 and capacitor 210 is terminated to ground via resistor 232. The common connection between capacitors 210 and 212 is connected to one end of a capacitor 211 connected in series with an inductor 224 terminated to ground. Terminal 206 is connected to one end of an inductor 225 in series with a capacitor 219 terminated to ground. The common connection between inductor 222 and capacitor 213 is connected to one end of the parallel combination of an inductor 226 and capacitor 214, the other end of which is connected to the common connection of parallel connected inductor 227 and capacitor 216, the other end of which is connected to the common connection of parallel connected inductor 228 and capacitor 218, the other end of which is connected to the common connection of inductor 225 and capacitor 219, as shown. A capacitor 215 is connected between the common connection of capacitors 214 and 216, and a source of reference potential, ground in this example. A capacitor 217 is connected between a common connection of capacitors 216 and 218 to ground. In summary, through use of such a high tap value plug-in module 18, as described, in cable television distribution systems utilizing high output amplifiers, can use a lower dB value tap such as a 23 dB tap with a high tap value plug-in to achieve a high dB tap value for the forward path. For example, a 23 dB multi-tap with a 9 dB high tap value plug-in will provide a 23 dB reverse path loss, and a 32 dB forward path loss. In association with cable modems generating return signals, a lower return path attenuation is provided in the high value taps, thereby permitting the cable modems to overcome the large passive loss typically associated with such high value taps. Also, the carrier-to-noise/ingress figure of the cable modem signal is increased. The values of the components of the high tap value filter, such as those in the circuit of FIG. 20A, are adjusted in order to provide a desired reduction in the return path attenuation of a particular multi-tap. FIG. 20B shows an example of a desired frequency response curve for the circuit of FIG. 20A.

Figure 21:
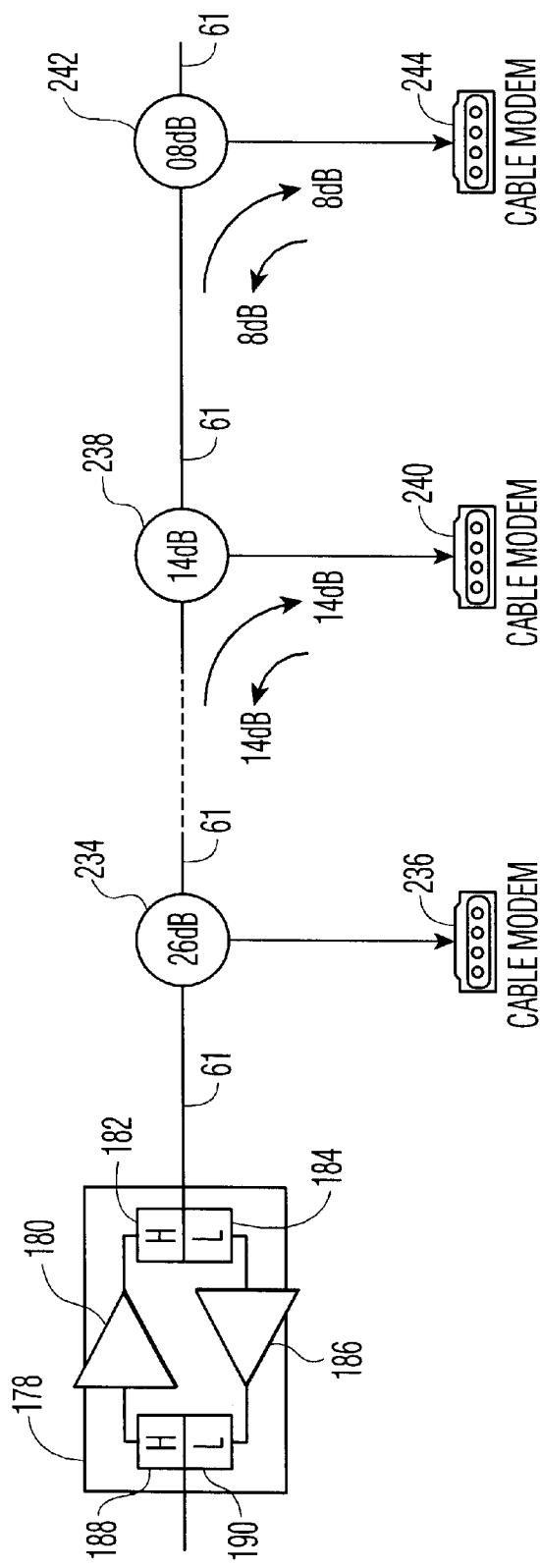
FIG. 21 is a simplified block schematic diagram showing a prior conventional cable television distribution system including a plurality of multi-taps and cable modems at subscriber locations, in which system as illustrated the cable modems produce high output level return signals for return through low DB valued taps, causing the return signal from the modems to be excessively high, in turn causing a distortion in the associated return amplifier of the cable system, also, this causes the return path to be unequalized due to the return path signal level from each multi-tap being different.
Figure 22:
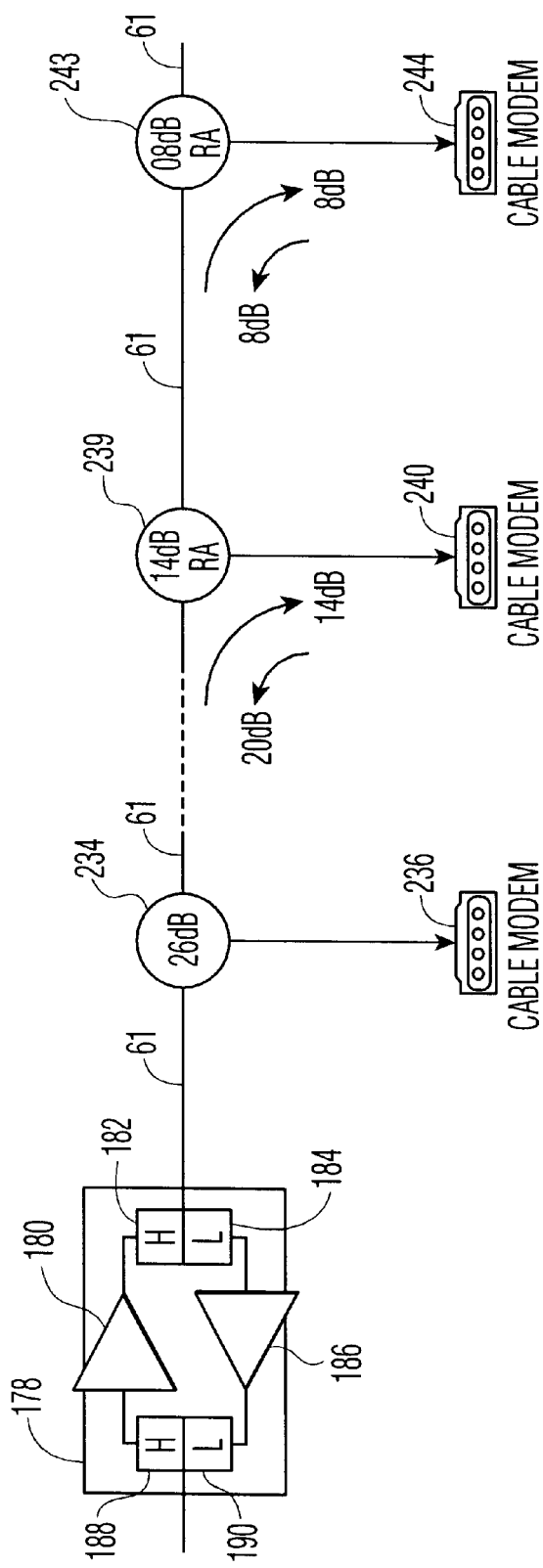
FIG. 22 shows a simplified block schematic diagram of a cable television distribution system including a plurality of multi-taps of the present invention, with a number of the multi-taps shown in this embodiment including plug-in return path attenuator filters (RA), for overcoming the problems of the conventional cable television distribution system shown in FIG. 21.

In FIG. 21 a conventional cable distribution system is shown to include a high output amplifier 178, 26 dB multi-tap 234, 14 dB multi-tap 238, and 6 dB multi-tap 242, connected in the main cable 61 line. In this conventional system, the low value multi-taps 238 and 242 permit excessively high levels of the return signals from the cable modems to return to the amplifier 178, causing distortion in the return amplifier 186. Typically, the level of the return path signal from each of the associated multi-taps will be different, preventing equalization of the return path signals due to the low return path losses, as indicated.

To overcome the problems of a conventional television distribution system as described for that of FIG. 21, above, in another embodiment of the invention a return path attenuator plug-in filter is provided in the plug-in module 18. Through use of such a return path attenuator filter circuit, to be described in greater detail below, the return signal path of the system functions reliably, for return signals such as digital communication signals. The return path attenuators provide for maximization of the carrier-to-noise ratio. In this embodiment of the invention, the purpose of the return path attenuator filters and the plug-in modules 18 is to equalize the return path signals from each household or subscriber to have the same or substantially the same optimal signal level to avoid saturation of devices upstream, such as return amplifier 186 of amplifier module 178.

Figure 23A:
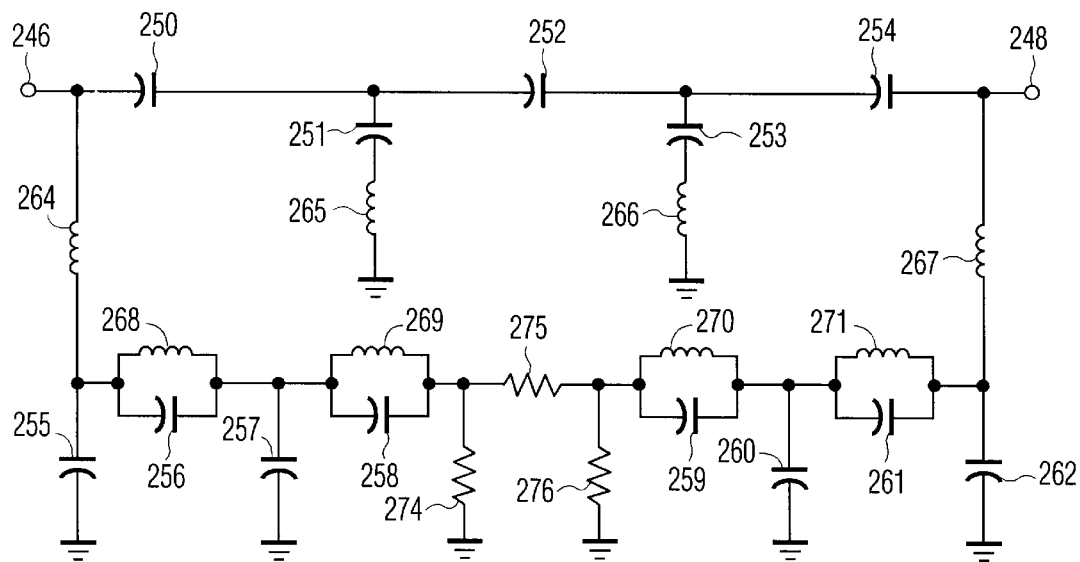
FIG. 23A shows a circuit schematic diagram of a return path attenuator plug-in device or module for one embodiment of the invention.
Figure 23B:
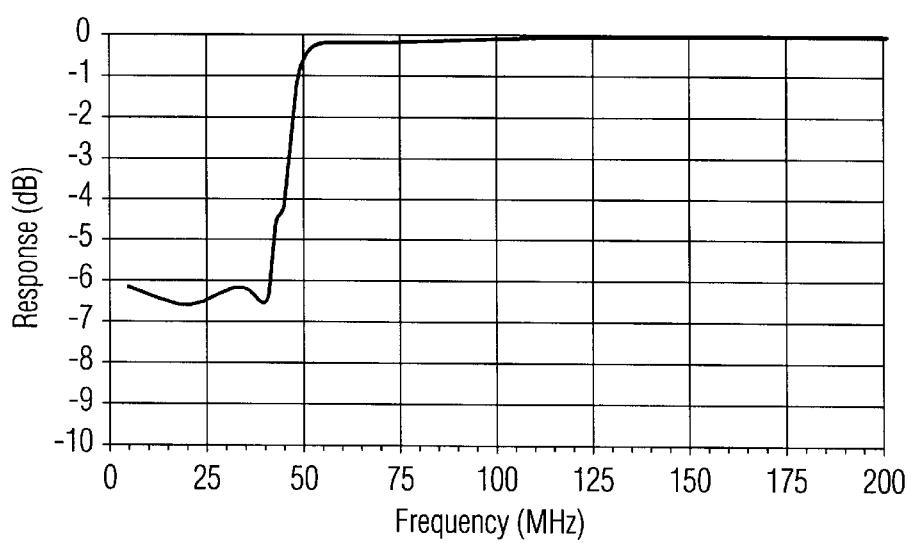
FIG. 23B shows a typical frequency response curve for the circuit of FIG. 23A.

A preferred circuit for providing the return path attenuator filter (RA) in a plug-in module 18 is shown in FIG. 23A. In the example given, since the forward signal path is already equalized, no changes are required in the forward path, thereby requiring only the provision of reverse or return path equalization, as described. As shown in FIG. 23A, a preferred return path attenuator circuit includes capacitors 250, 252, and 254 connected in series between connection points or terminals 246 and 248. The common connection between terminal 246 and capacitor 250 is connected to one end of an inductor 264 connected in series with a capacitor 255 terminated to a source of reference potential, ground in this example. The common connection between capacitors 250 and 252 is connected to one end of a capacitor 251 connected at series with an inductor 265 terminated to ground. The common connection between capacitor 252 and capacitor 254 is connected to one end of a capacitor 253 connected in series with an inductor 266 terminated to ground. The common connection between capacitor 254 and terminal 248 is connected one end of an inductor 267 connected in series with a capacitor 262 terminated to ground. Connected from the common connection of an inductor 264 and capacitor 255 to the common connection of inductor 267 and capacitor 262, is a series connected circuit successively including from the common connection of inductor 264 and capacitor 255 an inductor 268 connected in parallel with the capacitor 256, an inductor 269 connected in parallel with the capacitor 258, a resistor 275, an inductor 270 connected in parallel with the capacitor 259, and an inductor 271 connected at parallel with the capacitor 261, terminating at the common connection of inductor 267 in capacitor 262. A capacitor 257 is connected between a common connection of capacitors 256 and 258 and ground. A resistor 274 is connected between a common connection of capacitor 258 and resistor 275 to ground. A resistor 276 is connected between a common connection of resistor 275 and capacitor 259 to ground, and a capacitor 260 is connected between a common connection of capacitors 259 and 261 to ground, as shown. The values of the various components of the return path attenuator of circuit of FIG. 23A are specified in accordance with the desired level of return path attenuation over the frequency band. FIG. 23B shows an example of a desired frequency response curve for the circuit of FIG. 23B.

In summary, the return path attenuator filter provided in a plug-in module 18 is typically used in systems employing high speed data services utilizing the return path to the headend. Typically, the present invention employs the use of a return path attenuator filter in association with low value multi-taps near the end of the distribution system where low value multi-taps are incorporated in the return path. Such a return path attenuator filter provides for additional attenuation in the return path for allowing a cable modem to operate at a higher output level for increasing the carrier-to-noise/ingress ratio. Also, through use of the return path attenuation filter (RA) any ingress or noise coming from the modem of the subscriber is attenuated, thereby improving the reliability of the return path. Use of an RA filter also prevents return amplifiers/fiber transmitters from being overdriven.

In another embodiment of the invention, a high pass filter circuit is incorporated in the plug-in module 18 for use in cable distribution television systems including cable modem services, whereby the high pass filter blocks noise and ingress from entering the return path on return signals generated in the customers drop system, that is at a subscriber location typically via a modem. A major problem associated with the return signal system is noise and ingress, whereby typically 70% to 90% of the noise and ingress experienced on a cable television distribution system is generated from the drop system or from subscribers with return signals. By using high pass filters in the plug-in modules in multi-taps not requiring digital data, low frequency noise and ingress signals in the drop return path are prevented from entering the distribution return path, thereby reducing the noise and ingress return path.

Figure 24:
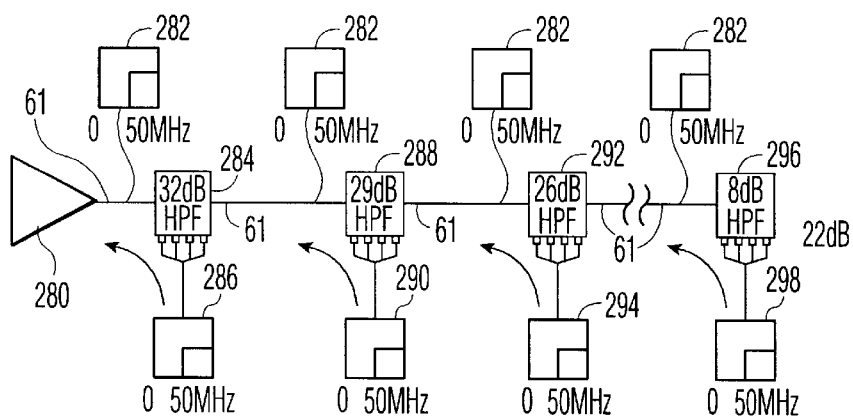
FIG. 24 shows a simplified block schematic cable television distribution system including a plurality of multi-taps incorporating high pass filter plug-in devices or modules, respectively, for one embodiment of the invention to block noise and ingress that generated by subscribers or customers in the associated drop system from entering the return path.
Figure 25A:
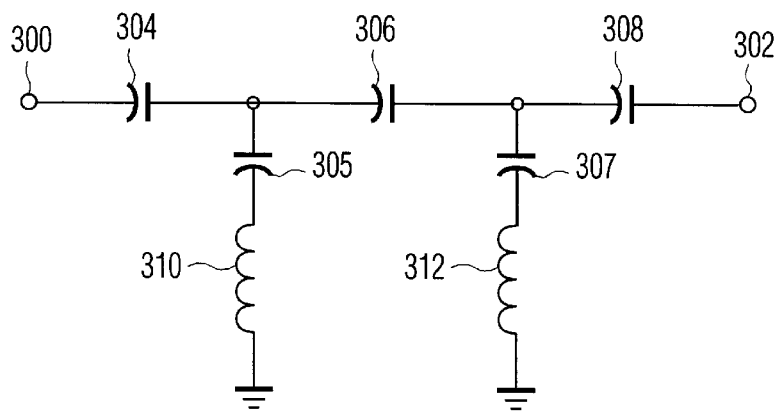
FIG. 25A shows a circuit schematic diagram of a high pass filter (HP) for use in high pass filter plug-in devices or modules of one embodiment of the present invention.
Figure 25B:
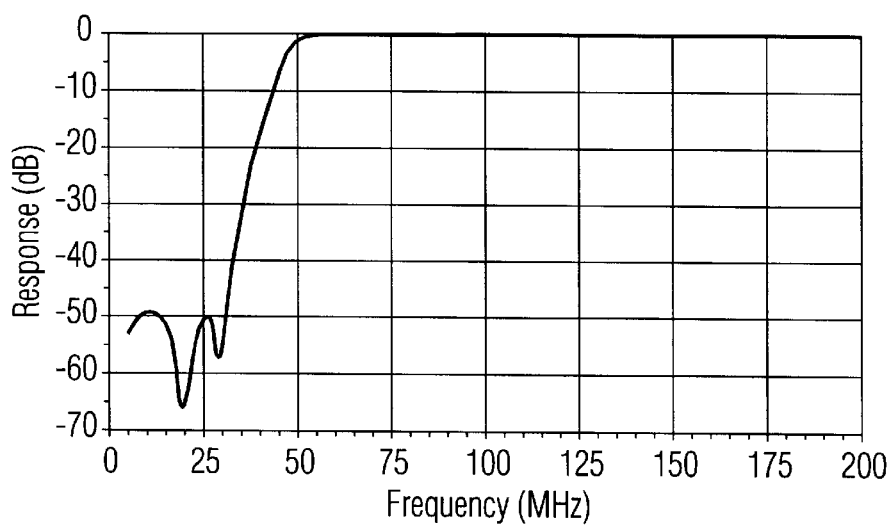
FIG. 25B shows a typical frequency response curve for the circuit of FIG. 25A.

As shown in FIG. 24, a distribution system for one embodiment of the present invention includes an amplifier 280 driving a main cable 61 having a 32 dB multi-tap 284, 29 dB multi-tap 288, 26 dB multi-tap 292, and 8 dB multi-tap 296 connected in spaced apart relation along the main cable 61. Each of these multi-taps include a plug-in module 18 incorporating a high pass filter circuit. A preferred high pass filter circuit for such use is shown in FIG. 25A. As shown by the frequency response curves 282 in each portion of the main cable 61, the use of the high pass filter circuit in each multi-tap prevents noise and ingress below 50 MHz from entering the return path. With more specific reference to FIG. 25A the preferred high pass filter circuit for this embodiment of the invention includes capacitors 304, 306, and 308 connected in series between connection points or terminals 300 and 302. The common connection of capacitors of 304 and 306 is connected to one end of a capacitor 305 connected in series with an inductor 310 terminated to a source of reference potential, ground in this example. The common connection between capacitor 306 and 308 is connected to one end of a capacitor 307 connected in series with an inductor 312 terminated to ground. The component values of this preferred high pass filter circuit are adjusted in order to obtain a desired degree of low pass filtering. FIG. 25B shows an example of a desired frequency response curve for the circuit of FIG. 25A.

Figure 26:
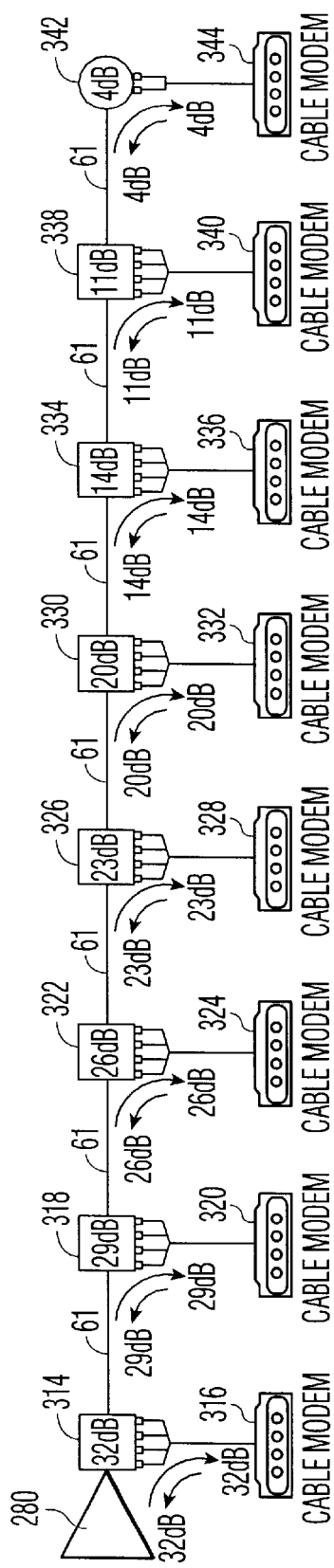
FIG. 26 shows a simplified block schematic diagram of a prior conventional cable television distribution system including a plurality of multi-taps feeding signals to subscribers having cable modems generating return signals, wherein there is no control for reducing two acceptable levels the ingress and noise on the associated return paths from the respective cable modems.

As previously indicated, with the advent of cable modem service being provided in cable television distribution systems, for permitting return signals to the headend, the maintenance of consistent cable modem carriers, along with control of ingress and noise on the return path is a major challenge. Typical cable television distribution systems, such as shown in FIG. 26, are designed to optimize performance in the forward signal direction, but are deficient in maintaining a return signal path that either has too much passive loss or too little passive loss. This is clearly shown in the system of FIG. 26. More specifically, an amplifier 280 is used to drive a main cable 61 including a 32 dB multi-tap 314, 29 dB multi-tap 318, 26 dB multi-tap 322, 23 dB multi-tap 326, 20 dB multi-tap 330, 14 dB multi-tap 334, 11 dB multi-tap 338, and 4 dB multi-tap 342, successively connected as shown. Each of the aforesaid multi-taps are associated with a cable modem 316, 320, 324, 328, 332, 336, 340, and 344, respectively. It is preferred that the cable modem operate at as high a signal level as possible to obtain the highest possible signal-to-noise/ingress ratio for reliable transmission. The multi-taps 314, 318, and 322 provide excessive attenuation in the return path, reducing the reliability of the return path signals. Contrary to this, the multi-taps 330, 334, 338, and 342 have insufficient attenuation in the return path, which can cause all of the problems such as overloading the return path amplifier 280, for example, as described above.

The present inventor recognized that is desirable to provide a return path design in cable television distribution systems that has an equal amount of passive loss at each multi-tap location. Such a system will equalize the amount of ingress and noise coming from the drop system, and allow all cable modems to operate at a higher level. To overcome these problems, high tap value filters, and return path attenuation filters, of the above-described various embodiments of the invention are incorporated in a cable television distribution system of the present invention as shown in FIG. 27.

Figure 27:
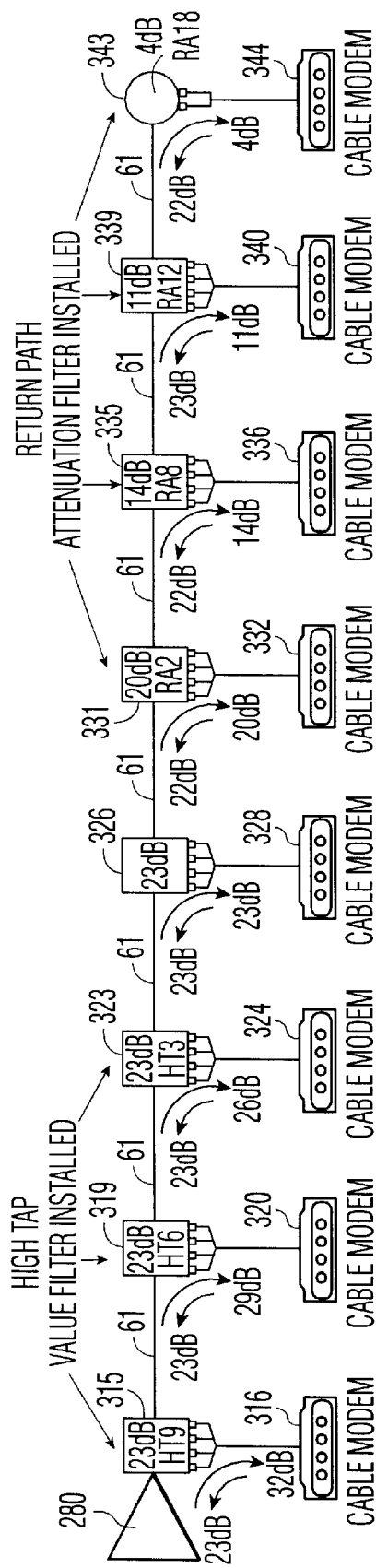
FIG. 27 shows a cable television distribution system including a plurality of multi-taps of the present invention, with a first portion of the multi-taps including the high tap value plug-in filters, and a second group of the multi-taps including plug-in return path attenuation filters, of the present invention, for overcoming the problems of the conventional cable television distribution system of FIG. 26.

More specifically, with reference to FIG. 27, in a multi-tap 315 uses a 23 dB multi-tap with a 9 dB high tap filter plug-in module 18 for reducing the return path attenuation to 23 dB, and to provide a 32 dB forward path tap loss; a 6 dB high tap filter in 23 dB multi-tap 319 is used to reduce the return path attenuation to 23 dB, and provide 29 dB forward path tap loss; and a 3 dB high tap filter is used in 23 dB multi-tap 323 to also reduce the return path attenuation to 23 dB, and provide a 26 dB forward path tap loss. The 23 dB conventional multi-tap 326 is the same as that of the conventional system of FIG. 26, providing a 23 dB attenuation in the return path. Return path attenuation filters as described above are provided in plug-in modules 18 for each one of 20 dB multi-tap 331, 14 dB multi-tap 335, 11 dB multi-tap 339, and 4 dB multi-tap 343, more specifically including 2 dB, 8 dB, 12 dB, and 18 dB return path attenuation filters, respectively, as shown, for providing return paths having 22 dB attenuation, 23 dB attenuation, and 22 dB attenuation, respectively. Accordingly, in the cable television distribution system of the present invention of FIG. 27, the attenuation and return signal paths have been substantially equated to within 1 dB of one another, as indicated. In the present invention, by utilizing such a combination of filters, one can equalize return path attenuation for substantially any desired cable television distribution system.

Figure 28:
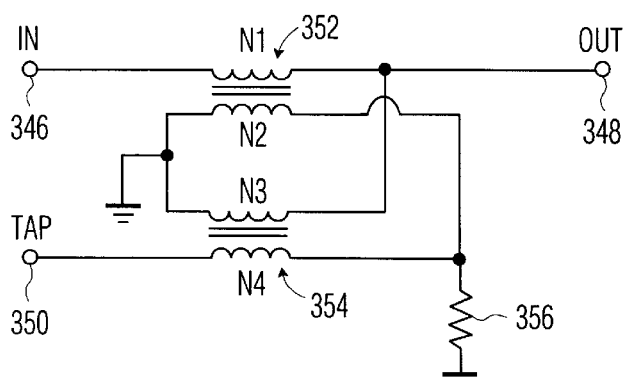
FIG. 28 shows a circuit schematic diagram of a directional coupler plug-in device or module for one embodiment of the invention, which directional coupler circuit can also be utilized in hardwired form on the PC board of a tap plate.

As previously indicated, in one embodiment of the invention the directional coupler circuitry is hardwired onto the printed circuit 14, whereas in other embodiments of the invention a plug-in module 16 is provided containing the directional coupler circuit. In FIG. 28 a preferred directional coupler circuit is shown to include a toroid transformer 352 having a primary winding N1 connected between an input terminal 346 and an output 348, and a secondary winding N2 connected between a source of reference potential ground in this example and the common connection of a resistor 356 and one end of a secondary winding N4 of another toroid transformer 354. The other end of resistor 356 is terminated to ground. The toroid transformer 354 has the other end of the secondary winding N4 connected to a tap terminal 350, and a secondary winding N3 connected at one end to output terminal 348, and at its other end terminated to ground. The turns ratio N1/N2 of the transformer 352, and the turns ratio N3/N4 of transformer 354 are designed for providing the level of directional coupling or signal level tap off from the main cable, as desired.

A cable system designer, through use of the present invention, can utilize various plug-in circuitry to obtain a desired system performance with lowest system cost or highest system performance. For example, to obtain maximum return path equalizing with no effect in the forward path which typically has been equalized, a return attenuation (RA) return path attenuation plug-in circuit of FIG. 23A should be used. A lower cost system design can utilize an equalization circuit as in FIG. 12A, or a cable simulator circuit as in FIG. 15A, or a return path attenuator circuit as in FIG. 23A, in some combination to obtain desired system performance. Accordingly, through use of appropriate plug-in circuitry any system requirement can be obtained.

Figure 29A:
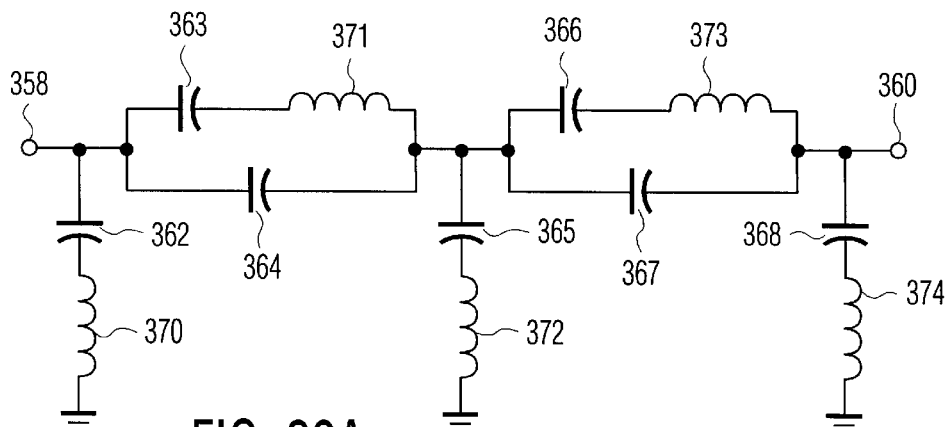
FIG. 29A shows a circuit schematic diagram of a band reject filter plug-in device or module for an embodiment of the invention.
Figure 29B:
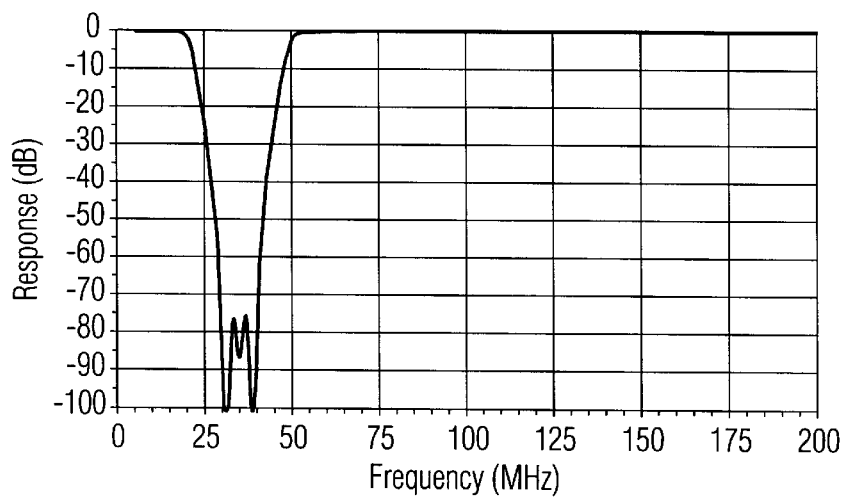
FIG. 29B shows a typical frequency response curve for the circuit of FIG. 29A.

In FIG. 29A a preferred circuit for a band reject filter is shown. Such a filter can be incorporated in a plug-in module 18 in various embodiments of the invention, or a plug-in module 19, such as in the third embodiment of the invention, for rejecting signals falling within a frequency band not authorized for use by a given subscriber, or to eliminate any noise or ingress, or other interference that may be caused by signals contained within this band. As shown, the band reject filter includes a capacitor 362 connected at one end to a terminal 358, and at its other end in series with an inductor 370 terminated to a source of reference potential, ground in this example. Terminal 358 is also connected to one end of a capacitor 364 connected in parallel with the series circuit of a capacitor 363 and an inductor 371, with the other ends of the capacitor 364 and inductor 371 being connected in common to one end of a capacitor 365 connected in series with an inductor 372 terminated to ground. The common connection of the capacitor 364, inductor 371, and capacitor 365 is also connected to one end each of a capacitor 366 and a capacitor 367. The other end of the capacitor 366 is connected in series with and to one end of an inductor 373, the other end of which is connected to the other end of capacitor 367 and to a terminal 360. Terminal 360 is also connected to one end of a capacitor 368 connected in series with an inductor 374 terminated to ground. The values of these components are adjusted in a given application for providing a desired band rejection of a specific frequency range. FIG. 29B shows an example of a desired frequency response curve for the circuit of FIG. 29A.

Figure 30:
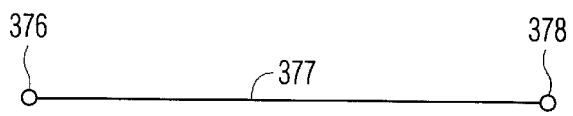
FIG. 30 shows a schematic diagram for a feed through plug-in device or module for an embodiment of the invention.

In certain applications, the plug-in modules 18, 19, through nth plug-ins 21, may or may not be required to incorporate various of the equalization and filter circuits previously to described. In such instances, where a particular plug-in module is not to be utilized, a transmission line jumper circuit is incorporated in the respective plug-in module to insure continuity of the associated signal path. Such a transmission line jumper circuit is shown in FIG. 30 to include a shunt path 377, or multiple shunt paths, as required, to insure an appropriate signal path between the directional coupler and the 2-way splitters 54, used in the various multi-tap configurations in the examples given above, as shown in FIGS. 8 and 9.

Figure 31A:
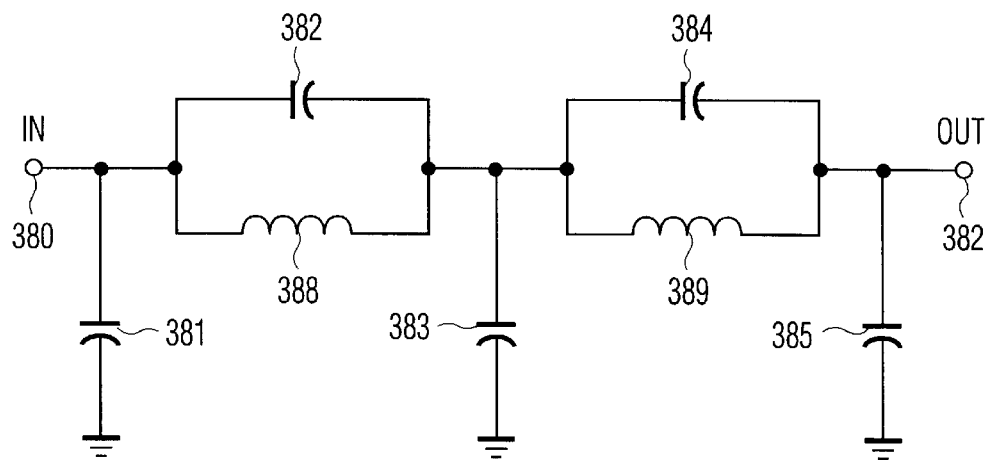
FIG. 31A shows a circuit schematic diagram of a low pass filter for an embodiment of the invention for allowing selected frequencies to pass to subscribers.
Figure 31B:
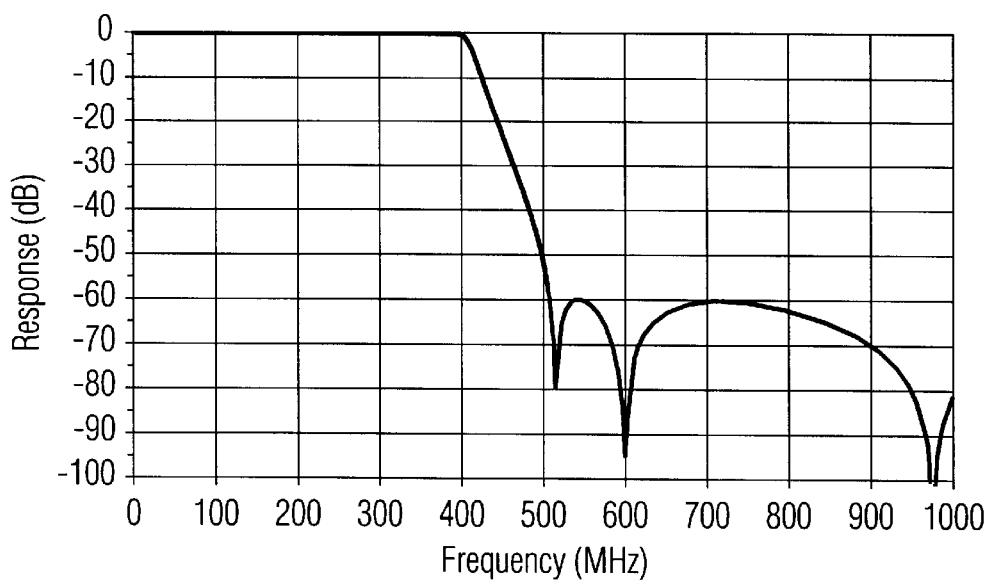
FIG. 31B shows a typical frequency response curve for the circuit of FIG. 31A.

In other applications, it may be desirable for the various embodiments of the invention to include a low pass filter circuit in the above-mentioned plug-in modules 18, 19, through to the nth plug-in 21, respectively, as shown in FIG. 9A preferred low pass filter circuit is shown in FIG. 31A, for allowing selected frequencies to pass to subscribers, while blocking other signal frequencies. As shown, the circuit includes an input terminal 380 connected to one end of a capacitor 381, the other end of which is terminated to a source reference potential ground, in this example. Terminal 380 is also connected to the parallel combination of a capacitor 382 and an inductor 388, the other end of which is connected to one end of a capacitor 383 terminated to ground. The common connection of capacitor 383 with capacitor 382 and inductor 388 is also connected to one end of the parallel combination of a capacitor 384 and inductor 389, the other end of the latter being connected to the common connection of an output terminal 382 and one end of a capacitor 385, the other end of the latter being terminated to ground. The values of the various components of the low pass filter of FIG. 31A are adjusted to provide the desired channel frequencies allowed to pass on to subscribers. FIG. 31B shows an example of a desired frequency response curve for the circuit of FIG. 31A. Through use of such a low pass filter circuit, the frequencies of channels which a subscriber has paid for are permitted to pass on to the subscriber, whereas other frequencies are blocked by the low pass filter circuits.

Note also that a high pass filter circuit is used to block forward signals in the frequency band from 5 to 40 MHz relative to subscribers who are not using the return path. If such a subscriber later desires to use return path signaling, the plug-in module containing the high pass filter can be replaced by a plug-in module including a transmission line jumper, for example.

The various embodiments of the invention will now be summarized, as will the improvement provided by these embodiments over the prior art be further described. In one embodiment of the invention, a directional coupler is provided on the printed circuit board of a tap plate, along with a plug-in receptacle for receiving a plug-in module 18 that may include circuitry for providing noise filtering, and/or forward signal equalization and/or backward or return signal equalization, or other system performance requirements. In another embodiment of the invention, a plug-in module 16 is provided for the directional coupler circuitry, rather than hardwiring the directional coupler on the printed circuit board, thereby reducing the number of different tap plate printed circuit board combinations required for a given level of directional coupling. In other words, for a tap plate 3 having a given number of subscriber tap ports, the level of directional coupling to be provided can be obtained by selecting a plug-in module 16 to provide a desired level of directional coupling. In addition, a plug-in module 18 can be selected from a group of such modules for obtaining a desired noise filtering circuit, or forward or backward equalization circuit, or some combination of the same, or some other desired function.

In a third embodiment of the invention is discussed above in relation to FIG. 5, a first plug-in module 16 for providing a directional coupler of a desired level is used. Second and third plug-in modules 18 and 19 are also included, each for providing individually or in some combination forward equalization, return signal equalization and/or noise filtering. In a fourth embodiment of the invention a directional coupler plug-in module 16 is included in combination with up to n plug-in modules 21 (n=1,2,3,4 . . . ) each for providing one or a combination of n forward equalization, return equalization, noise filtering, and other desired functions.

The present invention, and its various embodiments, provide substantial improvements over known prior systems. In one prior system, a multi-tap is provided with a plug-in module that includes a directional coupling circuit having a given level of tap off attenuation, either individually or in combination with one or both of an equalization circuit for providing either a cable equalizer and/or a filter circuit. Such prior multi-taps require that the entire multi-tap unit of an existing system be replaced by the new prior multi-tap including the plug-in module. As previously described, in the present invention, in many applications, the combination of the tap plate 3 with the PCB 14, and plug-in modules of the various embodiments of the invention, can be substituted directly for the tap plate of an existing multi-tap device, without requiring total replacement of the entire multi-tap, which requires replacing the multi-tap housing, and its associated connector in a system, along with time consuming cable splicing.

Also, for the prior known multi-tap incorporating a plug-in module combining the functions of the directional coupling, alone, or in combination with either or both of an equalization circuit, and a filter, requires extensive inventory. For example, to provide a cable system installer with 10 different levels of directional coupling, 35 different levels of signal equalization for either a forward path or return path equalization, and 5 different filters, one must multiply these different combinations together, that is (10)(35)(5) to obtain the number of different plug-in modules that must be carried in inventory, namely 1,750. Contrary to this, for example, in the third embodiment of the invention for providing a directional plug-in module 16 for providing the directional coupling function, and two plug-in modules 18, 19 for providing the functions of equalization, and filtering, respectively, substantially less inventory is required for providing the same flexibility as the prior known system. More specifically, for the third embodiment of the invention, assume that 10 different directional coupling plug-in modules 16 are provided, along with 5 plug-in modules 18 providing different respective levels of cable equalization, and 5 providing different levels of cable simulators, further with 18 providing different levels of return path attenuation, 2 providing different levels of high pass filtering, and 5 providing different levels of high tap value circuitry, thereby providing 35 selectable plug-in modules 18 for equalization purposes; and additionally providing 5 plug-in modules 19 each containing a different notch filter; one need only add the number of different plug-in modules indicated to see that only 50 plug-in modules are required for providing the aforesaid flexibility in the third embodiment of the invention relative to the 1,750 different plug-in devices required by the known prior system incorporating a single plug-in module providing or a combination of the aforesaid functions.

Figure 32A:
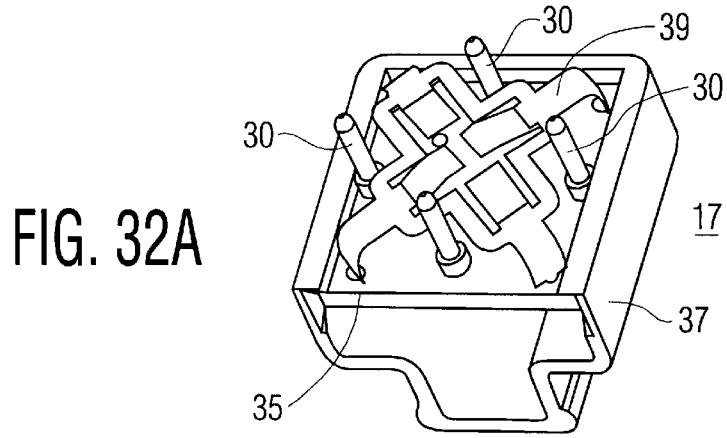
FIGS. 32A, 32B, 32C, and 32D show a pictorial view looking toward the bottom, a pictorial view looking toward the top, a right end elevational view (the left end elevational view being identical), and a front elevational view (the back elevational view being identical), respectively, of a plug-in module for providing a directional coupler for an alternative embodiment of the invention.
Figure 32B:
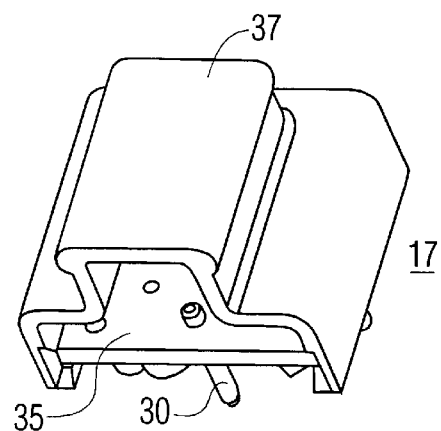
Figure 32C:
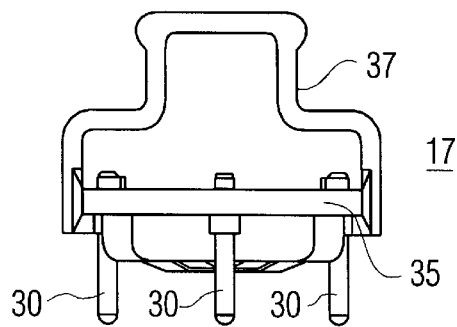
Figure 32D:
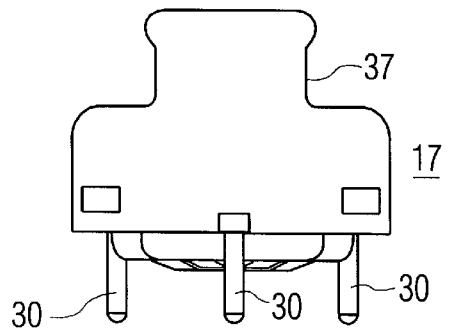

Although various embodiments of the invention have been shown and described herein, they are not meant to be limiting. Those of skill in the art may recognize various modifications to these embodiments, which modifications are meant to be covered by the spirit and scope of the appended claims. For example, the mechanical configuration for the directional coupler plug-in module 16 includes a vertically oriented PC board 34 (see FIG. 7E). In another embodiment of the invention, the directional coupler plug-in module is configured as shown in FIGS. 32A–32D for including a horizontally oriented PC board 35 in a housing 37. Electrical pins 30 and electromagnetic shielding 39 are located on the PC board 35, as shown. The associated sockets 24 must be oriented or reconfigured on PC board 14 (see FIG. 4) to the orientation of the pins 30 on PC board 35, as shown in FIG. 32A. The resulting lower profile directional coupler plug-in module 17 is shown installed on PC board 14 in FIG. 33.

What is claimed is:

1. A multi-tap kit for cable television systems comprising:
   at least one replaceable tap plate configured for installation into an existing or new housing;
   a plurality of subscriber tap ports located on an outside face of said tap plate;
   a printed circuit board (PCB) secured to an inside face of said tap plate;
   a directional coupler located on said PCB for providing a desired attenuation of signals tapped off of said cable for forwarding to customers or subscribers via said plurality of subscriber tap ports, respectively;
   a plurality of first electrical plug-in devices for providing different db levels of at least one or a combination of forward equalization, backward or return path equalization, cable simulation, high tap value filtering, high pass filtering, band rejection, low pass filtering, noise filtering, and shunting, respectively; and
   a first electrical receptacle on said PCB for receiving a selected one of said plurality of plug-in first devices.

2. The multi-tap kit of claim 1, further including:
   a plurality of said PCBs;
   a plurality of replaceable tap plates, each including one of said plurality of PCB's secured to an inside face thereof, a directional coupler on the associated respective PCB providing a different level of attenuation of signals tapped off of said cable relative to other ones of said directional couplers for forwarding to customers, and a said first electrical receptacle on the associated PCB.

3. The multi-tap kit of claim 2, further including:
   said plurality of replaceable tap plates each including at least two of said plurality of subscriber tap ports.

4. The multi-tap kit of claim 1, further including:
   a plurality of PCB's;
   a plurality of replaceable tap plates each having secured to a respective inside face, a respective one of said plurality of PCB's;
   a directional coupler on the associated PCB of each of said plurality of replaceable tap plates for respectively providing a desired level of attenuation of signals tapped off of said cable for forwarding to subscribers; and a desired number of said plurality of tap ports on each of said plurality of replaceable tap plates.

5. The multi-tap kit of claim 1, further including:

a plurality of replaceable tap plates each including a directional coupler on the PCB for providing the same level of attenuation of signals tapped off of said cable for forwarding to subscribers; and said plurality of replaceable tap plates each including a different number of subscriber tap ports on the associated tap plate, respectively.

6. The multi-tap kit of claim 1, further including:

a plurality of PCB's;

a plurality of groups of said replaceable tap plates;

each individual group of said replaceable tap plates providing the same number of subscriber tap ports, the number of subscriber tap ports provided in any one group being different from any other of said groups of said replaceable tap plates, respectively; and a different directional coupler being located on each respective PCB of said plurality of replaceable tap plates of each group thereof, for providing a different level of attenuation, respectively.

7. The multi-tap kit of claim 1, further including:

a second electrical receptacle on said PCB; and a plurality of second electrical plug-in devices each providing a directional coupler having a different level of attenuation, respectively, for permitting selection of a desired one thereof for insertion into said second electrical receptacle to provide a said directional coupler of a desired level or value.

8. The multi-tap kit of claim 7, further including:

a plurality of PCB's each including a said second electrical receptacle;

a plurality of replaceable tap plates each having secured to a respective inside face, a respective one of said plurality of PCB's; and a desired number of said plurality of tap ports on each of said plurality of replaceable tap plates.

9. The multi-tap kit of claim 1 further including:

a plurality of said first electrical receptacles on said PCB;

a plurality of second electrical plug-in devices a second electrical receptacle on said PCB; and a plurality of second electrical plug-in devices each providing a directional coupler having a different level of attenuation, respectively, for permitting selection of a desired one thereof for insertion into said second electrical receptacle to provide a said directional coupler of a desired level or value.

10. The multi-tap kit of claim 9, further including:

a plurality of PCB's each including a said second electrical receptacle;

a plurality of replaceable tap plates each having secured to a respective inside face, a respective one of said plurality of PCB's; and a desired number of said plurality of tap ports on each of said plurality of replaceable tap plates.

11. Multi-tap kits for a cable television system, each kit including a plurality of multi-taps, each for insertion along a main distribution cable, for tapping signals off of said cable and forwarding the signals individually to multiple customers, and for receiving individual return or backward signals from respective customers, and coupling the return signals to said cable, wherein for each kit the improvement comprises:

at least one replaceable tap plate including a desired number of subscriber tap ports, configured for installation into an existing or new housing;

a printed circuit board (PCB) secured to an inside face of said tap plate;

a plurality of first electrical plug-in devices for providing different db levels of attenuation, respectively, of directionally coupled signals tapped off of said cable for forwarding to subscribers;

a plurality of second electrical plug-in devices for providing different db levels of at least one or a combination of forward equalization, return path equalization, cable simulation, high tap value filtering, high pass filtering, band rejection, low pass filtering, shunting, and noise filtering, respectively; and first and second electrical receptacles on said PCB for receiving a selected one of said plurality of first and second plug-in devices, respectively.

12. The improvement of claim 11, further including:

a plurality of said replaceable tap plates;

a plurality of PCB's secured to an inside face of an associated one of said plurality of said replaceable tap plates; respectively;

each of said plurality of PCB's including a said first receptacle, and a said second receptacle.

13. The improvement of claim 11, further including:

a plurality of said PCB's each including a said first and second receptacle, respectively;

a plurality of groups of said replaceable tap plates; and each individual group of said replaceable tap plates including one of said plurality of said PCB's, and each providing the same number of subscriber tap ports, the number of subscriber tap ports provided in any one group being different from any other of said groups of replaceable tap plates, respectively.

14. The improvement of claim 11, further including:

a plurality of said second receptacles, each for receiving a different one of said plurality of second electrical plug-devices.

15. The improvement of claim 12, further including:

a plurality of said second receptacles, each for receiving a different one of said plurality of second electrical plug-devices.

16. The improvement of claim 13, further including:

a plurality of said second receptacles, each for receiving a different one of said plurality of second electrical plug-devices.

17. A multi-tap kit for cable television systems, said multi-tap kit comprising:

at least one replaceable tap plate configured for installation into an existing or new housing;

a plurality of subscriber tap ports located on an outside face of said tap plate;

a printed circuit board (PCB) secured to an inside face of said tap plate;

a plurality of first electrical plug-in devices for providing different db levels of attenuation, respectively, of directionally coupled signals tapped off of said cable for forwarding to subscribers;

a plurality of second electrical plug-in devices for providing different db levels of at least one or a combination of forward equalization, backward or return path equalization, cable simulation, high tap value filtering, high pass filtering, band rejection, low pass filtering, noise filtering, and shunting, respectively; and first and second electrical receptacles on said PCB for receiving a selected one of said plurality of first and second plug-in devices, respectively.

18. The multi-tap kit of claim 17, further comprising:

a plurality of third electrical plug-in devices for providing different db levels of at least one or a combination of forward equalization, backward or return path equalization, cable simulation, high tap value filtering, high pass filtering, band rejection, low pass filtering, noise filtering, and shunting, respectively; and a third electrical receptacle on said PCB for receiving a selected one of said plurality of third plug-in devices.

* * * * *